US011569838B2

(12) United States Patent
Tukel

(10) Patent No.: US 11,569,838 B2
(45) Date of Patent: Jan. 31, 2023

(54) HIGH EFFICIENCY CURRENT SOURCE/SINK DAC

(71) Applicant: Analog Devices International Unlimited Company, Limerick (IE)

(72) Inventor: Suat Sukuti Tukel, Orinda, CA (US)

(73) Assignee: Analog Devices International Unlimited Company, Limerick (IE)

( * ) Notice: Subject to any disclaimer, the term of this patent is extended or adjusted under 35 U.S.C. 154(b) by 174 days.

(21) Appl. No.: 17/197,692

(22) Filed: Mar. 10, 2021

(65) Prior Publication Data

US 2021/0320671 A1 Oct. 14, 2021

Related U.S. Application Data

(60) Provisional application No. 63/007,479, filed on Apr. 9, 2020.

(51) Int. Cl.
*H03M 1/00* (2006.01)
*H03M 1/66* (2006.01)
(Continued)

(52) U.S. Cl.
CPC ........... *H03M 1/66* (2013.01); *H02M 1/0003* (2021.05); *H02M 3/156* (2013.01)

(58) Field of Classification Search
CPC ...... H03M 1/66; H03M 1/002; H02M 1/0003; H02M 3/156; H02M 1/007; H02M 1/0025;
(Continued)

(56) References Cited

U.S. PATENT DOCUMENTS 6,331,830 B1 12/2001 Song et al.
6,650,265 B1 11/2003 Bugeja
(Continued)

FOREIGN PATENT DOCUMENTS

CN 110658866 A 1/2020
CN 113517892 10/2021
EP 1604446 B1 11/2018

OTHER PUBLICATIONS

"European Application Serial No. 21165530.3, Extended European Search Report dated Sep. 2, 2021", 15 pgs.
(Continued)

*Primary Examiner* — Jean B Jeanglaude
(74) *Attorney, Agent, or Firm* — Schwegman Lundberg & Woessner, P.A.

(57) ABSTRACT

A current source and/or current sink digital-to-analog converter (DAC) includes a DAC circuit that converts a digital code to an analog current or voltage signal, an optional transconductance circuit that converts a voltage output of the DAC circuit into a current signal, and an output circuit that amplifies a current output of the DAC circuit or optionally amplifies a current output of the transconductance circuit to set a desired high current output for application to an output of the current source and/or current sink DAC. A power supply control current may be coupled to a power supply circuit that supplies power to the output circuit of the current source and/or current sink DAC. The power supply control current adjusts the output of the power supply circuit to cause the current source and/or current sink DAC to operate at a higher power efficiency.

20 Claims, 11 Drawing Sheets

(51) Int. Cl.
*H02M 1/00* (2006.01)
*H02M 3/156* (2006.01)

(58) Field of Classification Search
CPC .............. H02M 1/0045; H03F 3/45475; H03F 1/0238; H03F 2200/468; H03F 2200/471; H03F 2200/481; H03F 2200/498; H03F 2200/75; G05F 3/262; G05F 3/26
USPC ........................................................ 341/126
See application file for complete search history.

(56) References Cited

U.S. PATENT DOCUMENTS

| | | | |
|---|---|---|---|
| 7,253,691 | B2 | 8/2007 | Okada |
| 7,375,472 | B2 | 5/2008 | Wong et al. |
| 7,764,213 | B2 | 7/2010 | Bartling et al. |
| 9,203,350 | B2 | 12/2015 | Dempsey et al. |
| 9,465,086 | B2 | 10/2016 | Orendi et al. |
| 10,345,837 | B1 | 7/2019 | Valencia |
| 2006/0244499 | A1 | 11/2006 | Miyata et al. |
| 2012/0153861 | A1* | 6/2012 | Katsis ................... G09G 3/025 315/291 |
| 2014/0266103 | A1 | 9/2014 | Wang et al. |
| 2016/0143102 | A1 | 5/2016 | Mcdonald, II et al. |
| 2016/0277032 | A1 | 9/2016 | Lin |
| 2018/0335792 | A1 | 11/2018 | Kuchipudi |
| 2019/0229738 | A1 | 7/2019 | Werner et al. |

OTHER PUBLICATIONS

Azcona, C, "Low-voltage low-power CMOS rail-to-rail V-l converters", Circuit Theory and Design (ECCTD), 20th European Conference On, IEEE, (Aug. 29, 2011), 182-185.

* cited by examiner

HIGH EFFICIENCY CURRENT SOURCE/SINK DAC

CLAIM OF PRIORITY

This application claims the benefit of priority of U.S. Provisional Patent Application Ser. No. 63/007,479, titled "HIGH EFFICIENCY CURRENT SOURCE/SINK DAC" to Suat S. Tukel, filed on Apr. 9, 2020, the entire contents of which being incorporated herein by reference.

FIELD OF THE DISCLOSURE

This document relates to a high efficiency current source or current sink digital-to-analog converter (DAC) and, more specifically, to a high efficiency current source or current sink DAC that can provide a programmable output current while dissipating a minimum amount of power.

BACKGROUND

Programmable current source or current sink digital-to-analog converters (DACs) operate by converting a precision DAC voltage or current into a high output current via an output circuit. The high output current can be 300 mA or greater.

Such current source/sink DACs have uses in optical communication systems for optical component biasing. Most of these current source/sink DACs have separate power supply pins for the precision DAC core ($VDD_{DAC}$) and an output circuit ($V_{DDX}/V_{SSX}$) that enables higher power efficiency. In general, most of the total power is dissipated in the output circuit. A solution to reducing power dissipation is to lower the power supply voltage of the output circuit. In the case of a current source DAC, by setting the power supply voltage of the output circuit lower than the precision DAC core power supply ($V_{DDX}<VDD_{DAC}$), significant power savings can be achieved. However, $V_{DDX}$ voltage cannot be lowered arbitrarily as there exists a minimum $V_{DDX}$ voltage, $V_{DDX}(MIN)$, below which the output circuit cannot function properly. For this reason $V_{DDX}$ can be set to be higher than or equal to $V_{DDX}(MIN)$. Another constraint on $V_{DDX}$ voltage is due to the minimum dropout voltage requirements of the output circuit. Dropout voltage, $V_{DROPOUT}$, is equal to ($V_{DDX}-V_{OUTX}$), where $V_{OUTX}$ is the voltage at the output pin of the current source DAC. Lowering $V_{DROPOUT}$ also improves power efficiency since the output circuit power is equal to $V_{DROPOUT} \cdot I_{OUT}$, where $I_{OUT}$ is the high output current of the current source DAC. However, similar to $V_{DDX}$, $V_{DROPOUT}$ cannot be arbitrarily lowered either, since the current source DAC requires $V_{DROPOUT}$ to be greater than a minimum value, $V_{DROPOUT}(MIN)$, to be functional. Given these two constraints, lower power dissipation and higher power efficiency can be achieved when $V_{DDX}$ is set to the higher of the two voltages, $V_{DDX}(MIN)$ and $V_{OUTX}+V_{DROPOUT}(MIN)$, or equivalently $V_{DDX}=\max\{V_{DDX}(MIN), V_{OUTX}+V_{DROPOUT}(MIN)\}$.

A typical application for a current source DAC is semiconductor optical amplifier (SOA) biasing. SOAs amplify light without converting it to electricity. For optimum performance, very accurate biasing (up to 16 bits of DAC resolution) is desired. Also, it is desirable to place SOAs in physically small optical modules, so reducing power dissipation is also desired. Accordingly, in scenarios where a current source DAC is used to bias a SOA, the output voltage $V_{OUTX}$ would be equal to $V_{SOA}$, where $V_{SOA}$ is the SOA forward voltage. In general, $V_{SOA}>V_{DDX}(MIN)$, so for higher power efficiency, $V_{DDX}$ can be set to $V_{OUTX}+V_{DROPOUT}(MIN)$ or equivalently to $V_{SOA}+V_{DROPOUT}(MIN)$ to reduce total power dissipation. $V_{SOA}$ and $V_{DROPOUT}(MIN)$ are not constant voltages and can dynamically vary due to changes in programmed DAC output current, process variations, change in voltage levels or temperature, or over time. However, $V_{DDX}$ voltage is generally set as a constant voltage and is not dynamically adjusted. Hence, worst case values for $V_{SOA}$ and $V_{DROPOUT}(MIN)$ are usually used to set $V_{DDX}$ to make sure the current source DAC remains functional as $V_{SOA}$ and $V_{DROPOUT}(MIN)$ vary.

The worst case values for $V_{SOA}$ and $V_{DROPOUT}(MIN)$ vary significantly compared to their nominal values, over programmed DAC output current, process variations, voltage, temperature, and over time, thus causing excess power dissipation by the current source DAC during nominal conditions. It is therefore desirable to be able to dynamically adjust $V_{DDX}$ voltage in the presence of aforementioned $V_{SOA}$ and $V_{DROPOUT}(MIN)$ variations, such that the power dissipation by the current source DAC is reduced compared to the case where $V_{DDX}$ voltage is set as a constant voltage and no dynamic adjustment is made.

SUMMARY OF THE DISCLOSURE

For at least the reasons noted above, it is desired to provide techniques for dynamically increasing or decreasing the ($V_{DDX}/V_{SSX}$) voltage of a current source/sink DAC in response to changes in $V_{OUTX}$ and $V_{DROPOUT}(MIN)$ due to process variation, voltage, temperature, or time. This document provides a description of a high efficiency current source or current sink DAC that can dynamically adjust its own output circuit power supply voltage to reduce power dissipation in the current source or current sink DAC by continuously tracking changes in the output voltage $V_{OUTX}$ and the minimum dropout voltage requirement $V_{DROPOUT}(MIN)$. The output circuit power supply of a current source/sink DAC is often supplied by a DC-DC voltage converter for higher power efficiency. A current source/sink DAC with a power supply control pin (PS_CTRL) may be further provided that can adjust the output voltage of a DC-DC voltage converter via sinking/sourcing a control current ($I_{CTRL}$) from its PS_CTRL pin. While the illustrated implementation is shown for a current source/sink DAC, the techniques described herein may be extended to any circuit with similar output circuit that would operate more efficiently by dynamically adjusting its own power supply.

For example, a current source/sink DAC can be provided that dynamically adjusts a DC-DC voltage converter that supplies voltage to the $V_{DDX}/V_{SSX}$ pin of the current source/sink DAC such that the current source/sink DAC operates under higher power efficiency. As mentioned before, theoretically, the highest power efficiency may be achieved when $V_{DDX}=\max\{V_{DDX}(MIN), V_{OUTX}+V_{DROPOUT}(MIN)\}$.

The current source or current sink DAC can include a precision DAC core that converts a digital code to an analog voltage signal, a transconductance circuit that converts the output of the precision DAC core, an analog voltage signal, into an analog current signal, and an output circuit that takes as input the analog current signal generated by the transconductance circuit and amplifies the analog current signal to a high output current signal to set a desired current output such as for application as the output of the current source or current sink DAC. The current source or sink DAC can also include a dedicated power supply pin for the exclusive use of the output circuit. The dedicated power supply pin can be connected to the output of a DC-DC voltage converter, which can include a feedback pin and a voltage setting resistor network. The current source or sink DAC can further include a power supply control pin that can sink or source a control current. This control current can be coupled to the feedback pin and to the voltage setting resistor network of the DC-DC voltage converter and can enable adjustment of the DC-DC voltage converter's output voltage.

A high efficiency power supply control loop (HEPSCL) that tracks changes in $V_{OUTX}$ and $V_{DROPOUT}(MIN)$ can be used to adjust the control current such that the output of the DC-DC voltage converter may be substantially equal to $\max\{V_{DDX}(MIN), V_{OUTX}+V_{DROPOUT}(MIN)\}$, which results in higher power efficiency compared to the case where the output of the DC-DC voltage converter is set as a constant voltage and no dynamic adjustment is made. The HEPSCL can be implemented as an auxiliary control loop to the main control loop of the DC-DC voltage converter, and would not interfere substantially with the dynamics of the main control loop. The HEPSCL can further be designed such that it turns on when a dropout condition is detected (e.g., $V_{DDX}(MIN)<V_{OUTX}+V_{DROPOUT}(MIN)$), and is turned off otherwise. The voltage setting resistor network of the DC-DC voltage converter can be designed such that the output of the DC-DC voltage converter may be equal to $V_{DDX}(MIN)$ when a dropout condition is not detected and HEPSCL is turned off. When a dropout condition is detected, HEPSCL turns on and dynamically increases the output voltage of the DC-DC voltage converter to $V_{OUTX}+V_{DROPOUT}(MIN)$, which results in higher power efficiency operation compared to setting the output of the DC-DC voltage converter as a constant voltage.

A significant potential benefit of the present approach of control is that the precision current source/sink DAC operates with reduced self-heating since the power dissipation may be reduced. As a result, the temperature drift of the important performance parameters of the DAC, such as nonlinearity, offset, and gain error can be reduced as well.

In some aspects, this disclosure is directed to a circuit to dynamically adjust an output circuit power supply voltage to reduce power dissipation in a current source or a current sink digital-to-analog converter by tracking changes in the output voltage and a minimum dropout voltage requirement, the circuit comprising: at least one of a current source or a current sink digital-to-analog converter comprising a digital-to-analog converter circuit that converts a digital code to an analog current output; an output circuit that amplifies the analog current output of the digital-to-analog converter circuit to set a desired high current output for application to an output of the at least one current source or current sink digital-to-analog converter; and a power supply circuit that supplies power to the output circuit and a power supply control current to the at least one current source or current sink digital-to-analog converter to adjust an output of the power supply circuit in response to a variation in at least one of an output of the output circuit or a minimum dropout voltage requirement of the output circuit.

In some aspects, this disclosure is directed to a method of dynamically adjusting an output circuit power supply voltage to reduce power dissipation in at least one of a current source or a current sink digital-to-analog converter by tracking changes in the output voltage and a minimum dropout voltage requirement, wherein the at least one of a current source or a current sink digital-to-analog converter includes a digital-to-analog converter circuit that converts a digital code to an analog current output, the method comprising: amplifying the analog current output of the digital-to-analog converter circuit to set a desired high current output for application to an output of the at least one current source or current sink digital-to-analog converter; and supplying power to an output circuit and a power supply control current to the at least one current source or current sink digital-to-analog converter to adjust an output of a power supply circuit in response to a variation in at least one of an output of the output circuit or the minimum dropout voltage requirement of the output circuit.

In some aspects, this disclosure is directed to a circuit for biasing a semiconductor optical amplifier (SOA), the circuit comprising: an optical component biased at a programmable current, the programmable current supplied by an output of at least one of a current source or current sink digital-to-analog converter, wherein the at least one current source or current sink digital-to-analog converter includes: an output circuit; and a power supply control current that is coupled to a power supply circuit that supplies power to the output circuit of the at least one current source or current sink digital-to-analog converter, the power supply control current adjusting an output of the power supply circuit in response to a variation in at least one of an output of the output circuit or a minimum dropout voltage requirement of the output circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

This document describes a circuit and a method for dynamically adjusting the power supply voltage of the output circuit of a current source/sink DAC, such that the current source/sink DAC operates at a higher power efficiency compared to the case when no such dynamic adjustments are made. The power supply voltage of the output circuit may be continuously adjusted in response to the changes in the output voltage of the current source/sink DAC and also in response to changes in the minimum dropout voltage requirements of the output circuit which may be due to changes in the programmed output current, manufacturing process variations, changes in voltage levels, temperature, and changes over time such as component aging. While the implementation focuses on a DAC, the techniques described may be extended to any circuit with a similar output circuit that outputs a programmable load current.

Programmable Current Source DAC

Figure 1:
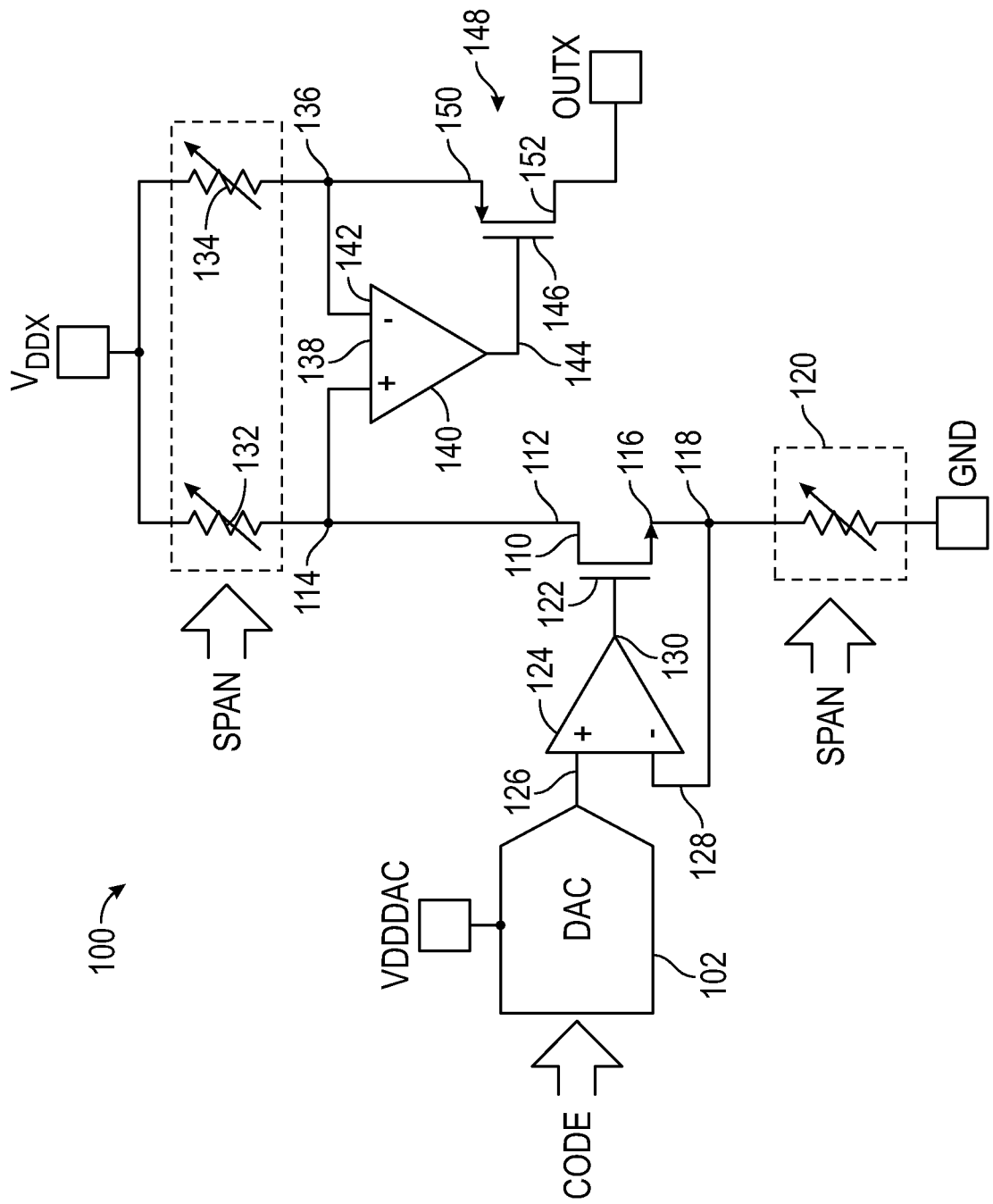
FIG. 1 illustrates a programmable current source digital-to-analog converter (DAC) that converts a precision DAC voltage into a high output current

FIG. 1 illustrates a programmable current source digital-to-analog converter (DAC) that converts a precision DAC voltage into a high output current that can be sourced (current out of the chip) to an external load. Programmable current source DACs of the type illustrated in FIG. 1 can be used in optical communications for optical component biasing, particularly for applications that require high output currents, such as of 300 mA or greater. Optical communication applications may require very accurate current biasing, for example, to bias a semiconductor optical amplifier (SOA) to achieve a specific optical gain or to adjust the output power of a laser diode of a laser pump used with an Erbium-Doped Fiber Amplifier (EDFA).

The optical component may also include a variable optical attenuator (VOA) that is adjusted by current biasing. As illustrated in FIG. 1, a separate precision DAC core ($VDD_{DAC}$) and output circuit supplies ($V_{DDX}$) can also be provided such as for higher power efficiency.

In FIG. 1, the programmable current source/sink DAC 100 can receive digital data (CODE) at a precision DAC 102 that may be powered by a low power voltage source ($VDD_{DAC}$). This digital data (CODE) allows the current source DAC 100 to be programmable by changing the output voltage of the precision DAC 102 in response to changes in digital data (CODE). An output of the precision DAC 102 can be applied to a transconductance circuit such as of the type described in commonly owned U.S. Pat. No. 9,203,350 such as can include an N channel FET 110 in series connection with a variable resistor 120. The transconductance circuit converts the output voltage of the precision DAC 102 to a current. In FIG. 1, the drain 112 of the FET 110 can be connected to the transconductance circuit output node 114, while the source 116 of the FET 110 can be connected to a first terminal of the variable resistor 120 at a resistor node 118. A second terminal of the variable resistor 120 can be connected to a reference voltage node such as ground (GND). A gate 122 of the FET 110 can function as a control terminal for the transconductance circuit. A differential amplifier 124 can be configured such that its input signal is the output of the precision DAC 102, which can be provided to a non-inverting input 126 of the differential amplifier 124. A voltage at resistor node 118, which effectively represents the voltage across the variable resistor 120, can be connected to an inverting input 128 of the differential amplifier 124. An output 130 of the differential amplifier 124 can be provided to the gate 122 of the N channel FET 110. In this configuration, the differential amplifier 124 can form part of a negative feedback loop to linearize the operation of the transconductance circuit such as by desensitizing the overall response of the transconductance circuit to non-linearities in the response of the FET 110 by a combination of high amplifier gain and negative feedback. The transconductance of the transconductance circuit may be controlled by using a digital control signal (SPAN) such as to change the impedance between the resistor node 118 and the reference voltage node (GND). It should be noted that the transconductance circuit is an optional circuit for the current source DAC 100 and is only used when the output of the precision DAC 102 is an analog voltage signal. The transconductance circuit is not used for current source DAC 100 operation when the output of the precision DAC 102 is an analog current signal.

To amplify the output current of the transconductance circuit or in the absence of the transconductance circuit to amplify the output current of the precision DAC 102 to generate a high output current for the programmable current source DAC 100 of FIG. 1, the output circuit can further include a pair of variable resistors 132 and 134, a differential amplifier 140, and a P-channel output FET 148.

The variable resistor 132 can be provided between the transconductance circuit output node 114 and the output circuit power supply pin $V_{DDX}$, while the variable resistor 134 can be provided between the output circuit power supply pin $V_{DDX}$ and node 136. As illustrated, the output circuit further includes a differential amplifier 140, and the transconductance circuit output node 114 may be connected to a non-inverting input 138 of the differential amplifier 140, while the node 136 may be connected to an inverting input 142 of the differential amplifier 140. The differential amplifier 140 provides an output 144 to a gate 146 of a P channel output FET 148 having a source 150 connected to the node 136 and a drain 152 connected to the output of the programmable current source DAC 100 (OUTX) to provide a high current output to a load. For example, OUTX may provide high amplitude bias currents (e.g., >300 mA) for a semiconductor optical amplifier. To change the current gain of the output circuit, the values of the variable resistors 132 and 134 may be controlled using a digital control signal (SPAN) that changes the respective resistances between the output circuit power supply $V_{DDX}$ and the respective nodes 114 and 136 at the respective inputs of the differential amplifier 140. In this configuration, the differential amplifier 140 forces equal voltage drop across resistors 132 and 134. By controlling the resistance of resistor 134 to be much less than resistor 132, high current gain from the output of the transconductance circuit to the current source DAC 100 output can be achieved, since that gain is equal to the resistance ratios of resistor 132 and resistor 134.

Figure 2:
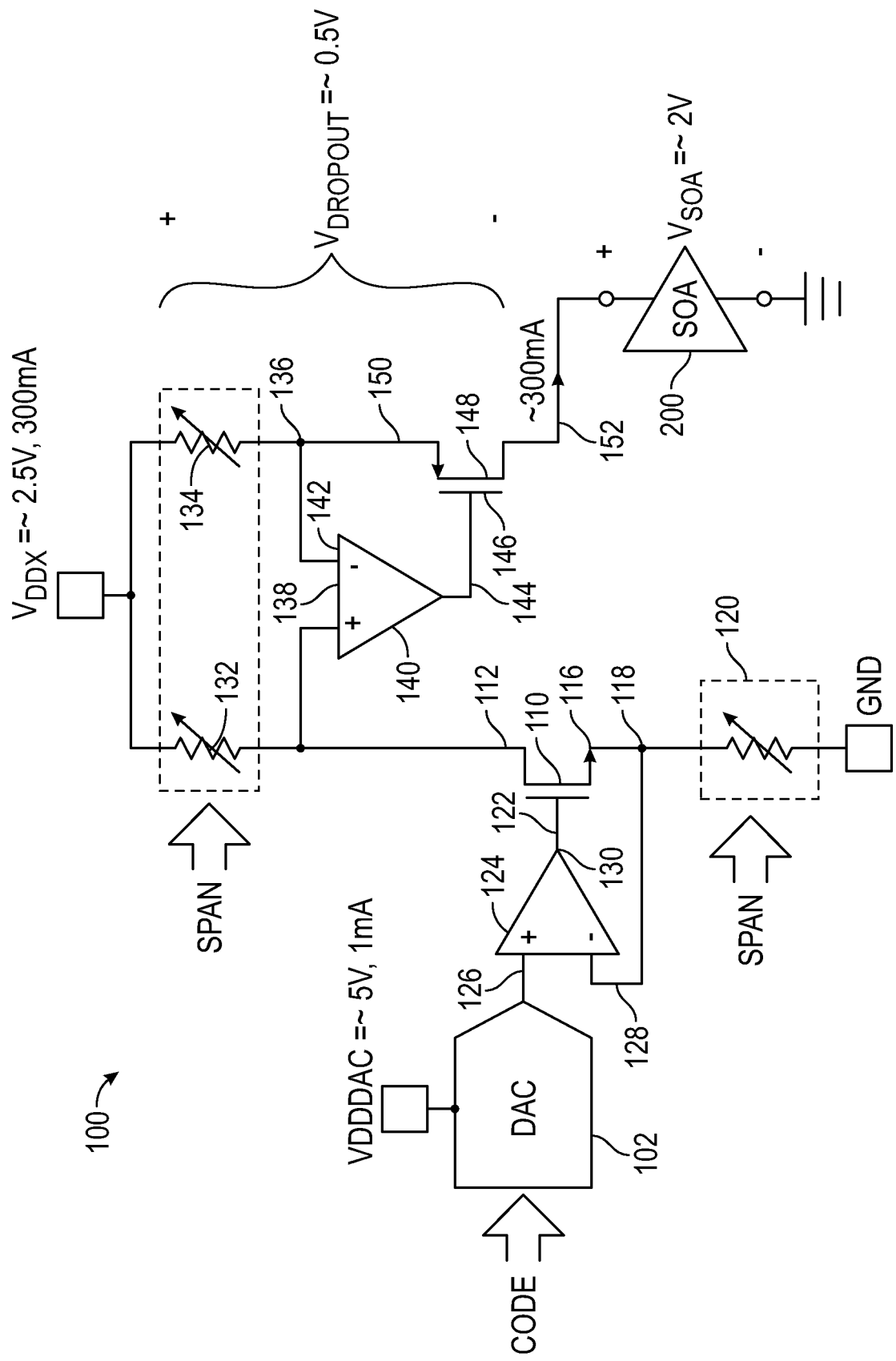
FIG. 2 illustrates an application of a programmable current source DAC for semiconductor optical amplifier (SOA) biasing.

FIG. 2 illustrates an application of a programmable current source DAC 100 such as of the type illustrated in FIG. 1 for semiconductor optical amplifier (SOA) biasing. SOAs can amplify light without converting the light to electricity. This process requires very accurate biasing for optimum performance (e.g., up to 16-Bits DAC resolution). Also, since the SOAs are typically placed in physically tiny optical modules, reducing power dissipation can be very important. In an example, the output circuit power supply $V_{DDX}$ can be set to $V_{OUTX}+V_{DROPOUT}(MIN)$ to reduce power, where $V_{OUTX}$ is the voltage at the drain 152 of the current source DAC 100, and $V_{DROPOUT}(MIN)$ is the minimum dropout voltage required to keep the current source DAC 100 in compliance and functional. The dropout voltage is the voltage drop across the output circuit and is equal to $V_{DDX}-V_{OUTX}$. In the example of FIG. 2, $V_{OUTX}$ may be equal to $V_{SOA}$, which is the forward voltage of the SOA 200. The $V_{DROPOUT}(MIN)$ requirement stems from the fact that both the resistor 134 and the P channel output FET 148 have finite DC resistance. Since the high output current of the current source DAC 100 flows through the resistor 134 and the P channel output FET 148, it causes a voltage drop across those devices due to ohm's law, which is equal to $I_{OUT} \cdot (R_{DC}(R\ 134)+R_{DCMIN}(PFET\ 148))$, where $I_{OUT}$ is the high output current of the current source DAC 100, $R_{DC}(R\ 134)$ is the DC resistance of the resistor 134, and $R_{DCMIN}(PFET\ 148)$ is the minimum DC resistance of the P channel output FET 148. Hence the dropout voltage, $V_{DDX}-V_{OUTX}$, should be greater than or equal to a minimum dropout voltage requirement of $V_{DROPOUT}(MIN)$, for the current source DAC 100 to be functional.

In the example shown in FIG. 2, typical values of 2V for $V_{SOA}$ and 0.5V for $V_{DROPOUT}(MIN)$ are used. Accordingly, the $V_{DDX}$ power supply voltage may be set to $V_{SOA}+V_{DROPOUT}(MIN)=2.5V$, and the SOA is biased at 300 mA forward current. It is important to note that the power dissipation of the output circuit is equal to dropout voltage*$I_{OUT}$ or equivalently 0.5V·0.3 A=0.15 W. Meanwhile, the power supply for the precision DAC 102 ($VDD_{DAC}$) may be set to 5 V and is only supplying 1 mA of current. So, the power dissipation of the precision DAC 102 is only 5V·0.001 A=0.005 W. The power efficiency for a current source DAC can be defined as, $$\eta = 100 \times \left(1 - \frac{P_{DAC}}{P_{Total}}\right),$$

where $P_{DAC}$ is the power dissipation of the current source/sink DAC and $P_{Total}$ is the total power drawn from the power supplies and is equal to $V_{DDX}*I_{OUT}+VDD_{DAC}*I_{DAC}$, where $I_{DAC}$ is the supply current of the precision DAC 102. For the example in FIG. 2, $$\eta \cong 100 \times \left(1 - \frac{0.15\ W + 0.005\ W}{0.75\ W + 0.005\ W}\right) \cong 79.5\%.$$

As mentioned before, in general most of the total power may be dissipated in the output circuit. This also highlights the benefit of having separate supply pins for the precision DAC 102 and the output circuit. By having a separate output circuit power supply pin, $V_{DDX}$ can be set lower than $VDD_{DAC}$ and power dissipation can be reduced. However, it should be noted that the $V_{DDX}$ cannot be set arbitrarily low. The differential amplifier 140 used in the output circuit also uses $V_{DDX}$ as its power supply for good power supply rejection performance and for turning on and off the P channel output FET 148 without over-voltaging its gate oxide. The differential amplifiers like the one used in the output circuit require their supply voltage to be higher than a certain voltage to function properly. The differential amplifier 140 is integral to the proper functioning of the current source DAC 100. Therefore, the output circuit power supply $V_{DDX}$ has to be greater than a minimum voltage $V_{DDX}(MIN)$, for the current source to be functional.

Another reason why $V_{DDX}$ cannot be lowered arbitrarily is the dropout voltage requirement. It can be observed for the example of FIG. 2 that the dropout voltage, $V_{DDX}-V_{OUTX}$, may be equal to the $V_{DROPOUT}(MIN)$ value, 2.5V-2.0V=0.5V. This is the best case scenario for power dissipation because, if $V_{DDX}$ was set to be lower to save power, the dropout voltage, $V_{DDX}-V_{OUTX}$, would be less than the minimum dropout voltage requirement $V_{DROPOUT}(MIN)$, hence the current source DAC 100 would not be functional. This example can be optimized for lower power dissipation and higher power efficiency. Combining the minimum $V_{DDX}$ voltage requirement and the minimum dropout voltage requirement, the power dissipation for the current source DAC 100 may be lowered significantly by having $V_{DDX}$ be substantially equal to the greater of $V_{DDX}(MIN)$ voltage and $V_{OUTX}+V_{DROPOUT}(MIN)$ voltage or equivalently max $\{V_{DDX}(MIN), V_{OUTX}+V_{DROPOUT}(MIN)\}$.

When the example of FIG. 2 is analyzed in the presence of process, voltage, or temperature variations, problems can be observed regarding the functionality of the current source DAC 100. As an example, if the SOA 200 forward voltage were to shift 0.1V higher due to temperature, the dropout voltage would equal 2.5V-2.1V=0.4V, which is lower than the minimum dropout voltage requirement $V_{DROPOUT}(MIN)$, which would result in current source DAC 100 failing to provide the 300 mA bias current for the SOA 200. One solution to this problem may be to set the $V_{DDX}$ voltage for the worst case values of $V_{OUTX}$ and $V_{DROPOUT}(MIN)$ over process variations, voltage levels, temperature and time. For example, a worst case SOA voltage of 2.2V can be used instead of the typical value of 2V and 0.7V worst case $V_{DROPOUT}(MIN)$ voltage can be used instead of the typical 0.5V. In this scenario, $V_{DDX}$ would be set to 2.2V+0.7V=2.9V. $V_{DDX}=2.9V$ would guarantee under worst case conditions that the current source DAC 100 would be functional. However, the power dissipation for typical cases would increase significantly. For example, when $V_{DDX}$ may be set to 2.9V and the SOA voltage is at its typical value of 2.0V, the dropout voltage will be 2.9V-2.0V=0.9V and the output circuit power dissipation would be 0.9V·0.3 A=0.27 W, for the 300 mA bias case. This is much higher than the earlier calculated typical power dissipation of 0.5V·0.3 A=0.15 W. The power efficiency would also be lower since $$\eta \cong 100 \times \left(1 - \frac{0.27\ W + 0.005\ W}{0.87\ W + 0.005\ W}\right) \cong 68.6\%.$$

Given this shortcoming of the example of FIG. 2, it is desirable to implement circuits and methods that can dynamically adjust the output circuit power supply $V_{DDX}$ for higher power efficiency operation in the presence of $V_{OUTX}$ and $V_{DROPOUT}(MIN)$ changes due to process, programmed DAC current, voltage, temperature and aging related variations.

Figure 3:
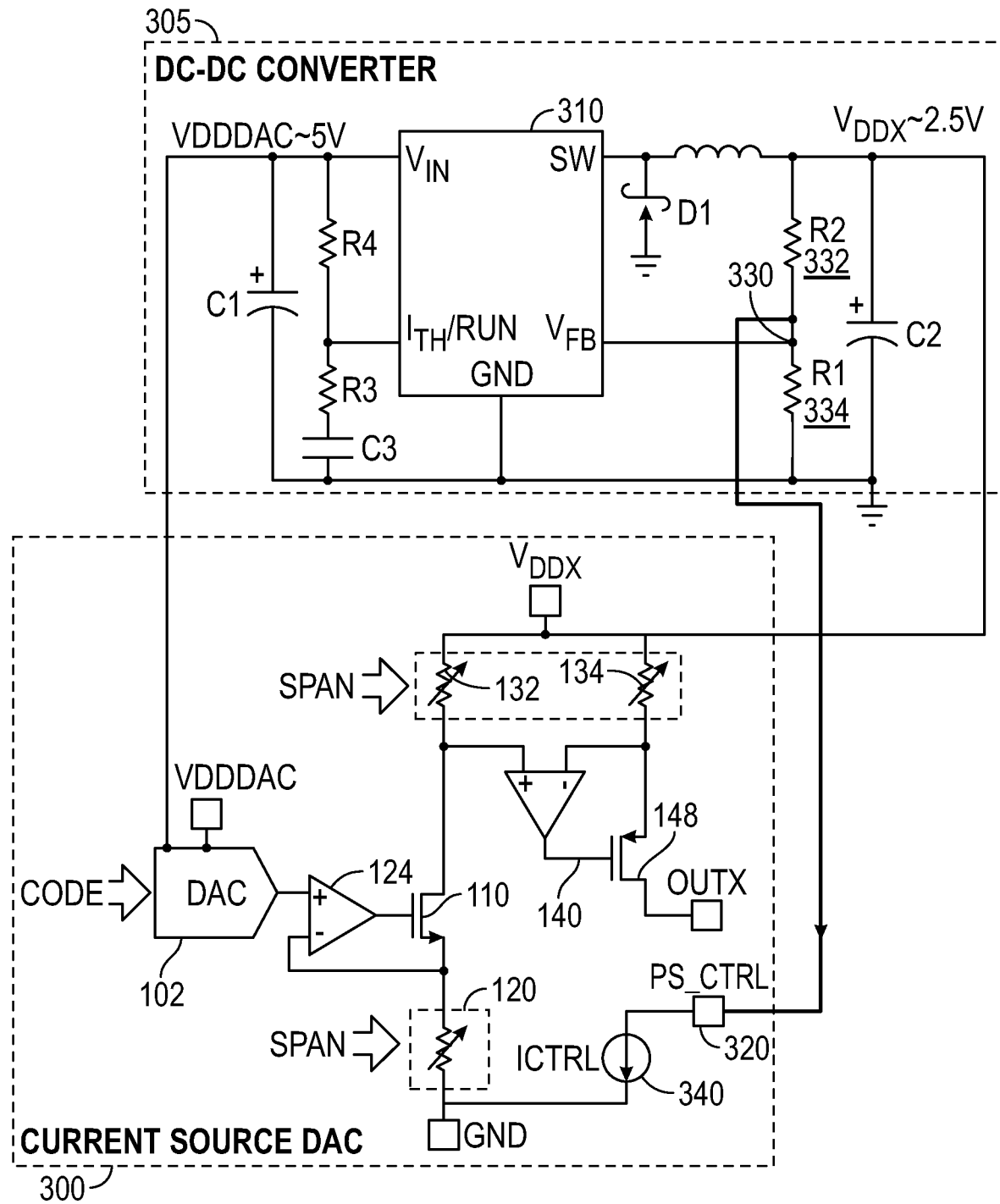
FIG. 3 illustrates a high efficiency current source DAC.

FIG. 3 illustrates an example of a high efficiency current source DAC 300. In FIG. 3, a high efficiency DC-DC voltage converter 305 including a buck converter chip 310 can be used to step down the $VDD_{DAC}$ voltage to the $V_{DDX}$ voltage for the circuits of FIG. 1 and FIG. 2. As in the example of FIG. 2, it can be assumed that $VDD_{DAC}$ is approximately 5 V while $V_{DDX}$ can be approximately 2.5 V. Generally, there exists a voltage setting resistor network to set the output voltage of DC-DC voltage converters. In FIG. 3, this voltage setting resistor network may be formed by feedback resistor R2 (332) and termination resistor R1 (334). Resistor R2 (332) may be connected from the output node $V_{DDX}$ of the DC-DC voltage converter 305 to the $V_{FB}$ pin 330 of the buck converter chip 310 and R1 (334) may be connected from the $V_{FB}$ pin 330 of the buck converter chip 310 to GND. In this configuration, $V_{DDX}$ may be calculated as: $(1+R2/R1)\cdot V_{FB}$ where $V_{FB}$ is a buck converter chip 310 specific feedback voltage and is usually between 1.25V and 0.6V.

As noted above, setting the DC-DC voltage converter 305 output for worst case values of $V_{DROPOUT}(MIN)$ and $V_{OUTX}$ may be disadvantageous, especially for power dissipation, since both $V_{DROPOUT}(MIN)$ and $V_{OUTX}$ can vary significantly, for example, as programmed DAC code, manufacturing process parameters, voltage levels, or temperature change. When $V_{DDX}$ is set using the voltage setting resistor network formed by R2 and R1, it may be a constant voltage that may be set for a worst case and cannot be dynamically adjusted. As mentioned before, it is desirable to further reduce the power dissipation by dynamically adjusting the $V_{DDX}$ voltage in response to changes in the values of $V_{OUTX}$ and $V_{DROPOUT}(MIN)$. However, this cannot be achieved by the sole use of the voltage setting resistor network as this results in a constant voltage $V_{DDX}$ output.

To address this issue, the current source DAC 300 of FIG. 3 can be modified to include a power supply control pin, PS_CTRL 320, that can be coupled to the feedback pin ($V_{FB}$) 330 of the buck converter chip 310 and the voltage setting resistor network of the DC-DC voltage converter 305. The DC-DC voltage converter 305 of FIG. 3 is shown to include a buck converter chip 310. For current source DACs, a buck/boost converter chip can also be used. For current sink DACs, an inverting converter chip or a SEPIC converter chip can be used.

For the current source DAC 300 illustrated in FIG. 3, PS_CTRL may be a current sink output that adjusts $V_{DDX}$ such that $$VDDX = \left(1 + \frac{R2}{R1}\right) \cdot V_{FB} + ICTRL \cdot R2,$$

where $I_{CTRL}$ 340 is the current flowing through the PS_CTRL pin 320 of the current source DAC 300. As mentioned before, there exists a minimum output circuit power supply voltage $V_{DDX}(MIN)$ for the current source DAC 300 to function properly. If the values of resistors R2 and R1 are chosen such that, $$\left(1 + \frac{R2}{R1}\right) \cdot V_{FB} = VDDX(MIN)$$

so that $V_{DDX}=V_{DDX}(MIN)+I_{CTRL}\cdot R2$, then the current source DAC 300 can dynamically adjust the $V_{DDX}$ voltage by adjusting the $I_{CTRL}$ current 340 for lower power dissipation and higher power efficiency as $V_{OUTX}$ and $V_{DROPOUT}$ (MIN) voltages vary due to elements such as process variation, voltage levels, temperature, and time. It is important to note that this method of adjusting the $V_{DDX}$ power supply voltage can work with commercially available DC-DC voltage converters and does not require any changes or customizations to the DC-DC voltage converter chips such as the buck converter chip 310 used in FIG. 3.

As mentioned before, the $V_{DDX}$ voltage should equal $\max\{V_{DDX}(MIN), V_{OUTX}+V_{DROPOUT}(MIN)\}$ for higher power efficiency operation. If $V_{DDX}$ is set to $V_{DDX}(MIN)$ for higher power efficiency, then the current source DAC 300 should adjust the $I_{CTRL}$ current 340 to be equal to zero amps. Similarly, if $V_{DDX}$ should equal $V_{OUTX}+V_{DROPOUT}(MIN)$, the current source DAC 300 should increase $I_{CTRL}$ current 340 until $V_{DDX}$ equals $V_{OUTX}+V_{DROPOUT}(MIN)$. This can be achieved by establishing a High Efficiency Power Supply Control Loop (HEPSCL), that takes as input $V_{DDX}(MIN)$, $V_{OUTX}$, $V_{DROPOUT}(MIN)$ and outputs $I_{CTRL}$ current 340 to be used for dynamically adjusting the output circuit power supply $V_{DDX}$ for higher power efficiency operation compared to the case when $V_{DDX}$ is set as a constant voltage.

If $I_{CTRL}$ current 340 is set according to the equations defined below, then the HEPSCL can guarantee proper current source DAC operation and higher power efficiency even under varying $V_{OUTX}$ and $V_{DROPOUT}(MIN)$ voltages due to process variation, voltage levels, temperature and time:

$$ICTRL = \begin{cases} 0, & \text{for } VOUTX < VDDX(MIN) - V_{DROPOUT}(MIN) \\ \dfrac{VOUTX - [VDDX(MIN) - V_{DROPOUT}(MIN)]}{R2}, & \text{for } VOUTX \geq VDDX(MIN) - V_{DROPOUT}(MIN) \end{cases}$$

then, $$VDDX = \begin{cases} VDDX(MIN), & \text{for } VOUTX < VDDX(MIN) - V_{DROPOUT}(MIN) \\ VOUTX + V_{DROPOUT}(MIN), & \text{for } VOUTX \geq VDDX(MIN) - V_{DROPOUT}(MIN) \end{cases}.$$

$V_{OUTX}$ is the voltage at the output of current source DAC 300, $V_{DDX}(MIN)$ is the minimum output circuit supply voltage for proper current source DAC operation, $V_{DROPOUT}(MIN)$ is the minimum dropout voltage ($V_{DDX}-V_{OUTX}$) required for proper current source DAC operation, and R2 is the resistance of the feedback resistor R2 332 of the voltage setting resistor network of DC-DC voltage converter 305. An important advantage of implementing $I_{CTRL}$ per the equations above is the fact that the HEPSCL is only utilized when a dropout condition, $V_{OUTX} \geq V_{DDX}(MIN)-V_{DROPOUT}(MIN)$, is detected. If a dropout condition is not detected, $I_{CTRL}$ equals zero amps and HEPSCL is effectively off. This allows the HEPSCL to be implemented as an auxiliary control loop, that is only used when needed, and relaxes the speed and stability requirements for the HEPSCL, since the HEPSCL is not required to be part of the main control loop for the DC-DC voltage converter 305.

Referring back to the example of FIG. 2, the power efficiency improvements may be calculated for the case where HEPSCL is used to dynamically adjust the $V_{DDX}$ voltage compared to setting the $V_{DDX}$ voltage as a constant voltage for worst case parameters. For worst case values of $V_{OUTX}=2.2V$ and $V_{DROPOUT}(MIN)=0.7V$, power efficiency was calculated to be $\eta \cong 68.6\%$ for the typical SOA voltage and $V_{DROPOUT}(MIN)$ case, when $V_{DDX}$ was set as constant voltage and no dynamic adjustments were made. When HEPSCL is used to dynamically adjust $V_{DDX}$ voltage, the efficiency will still be $\eta \cong 79.5\%$ for the typical SOA voltage and $V_{DROPOUT}(MIN)$ case, since HEPSCL tracks the SOA voltage and $V_{DROPOUT}(MIN)$ and would dynamically adjust $V_{DDX}=2.5V$. For the case when both SOA voltage and $V_{DROPOUT}(MIN)$ shift to their respective worst case values of 2.2V and 0.7V for example due to temperature change, then the HEPSCL would dynamically adjust $V_{DDX}$=2.9V and the corresponding efficiency would be $$\eta \cong 100 \times \left(1 - \frac{0.21\ W + 0.005\ W}{0.87\ W + 0.005}\right) \cong 75.4\%$$

which is higher than the efficiency of 68.6% achieved when $V_{DDX}$ voltage is set as a constant voltage and HEPSCL is not used. Utilizing a HEPSCL not only offers higher efficiency for typical conditions, but also results in higher efficiency when $V_{OUTX}$ and $V_{DROPOUT}$(MIN) vary to their worst case values due to possible changes in programmed DAC code, temperature, voltage levels or time.

Figure 4:
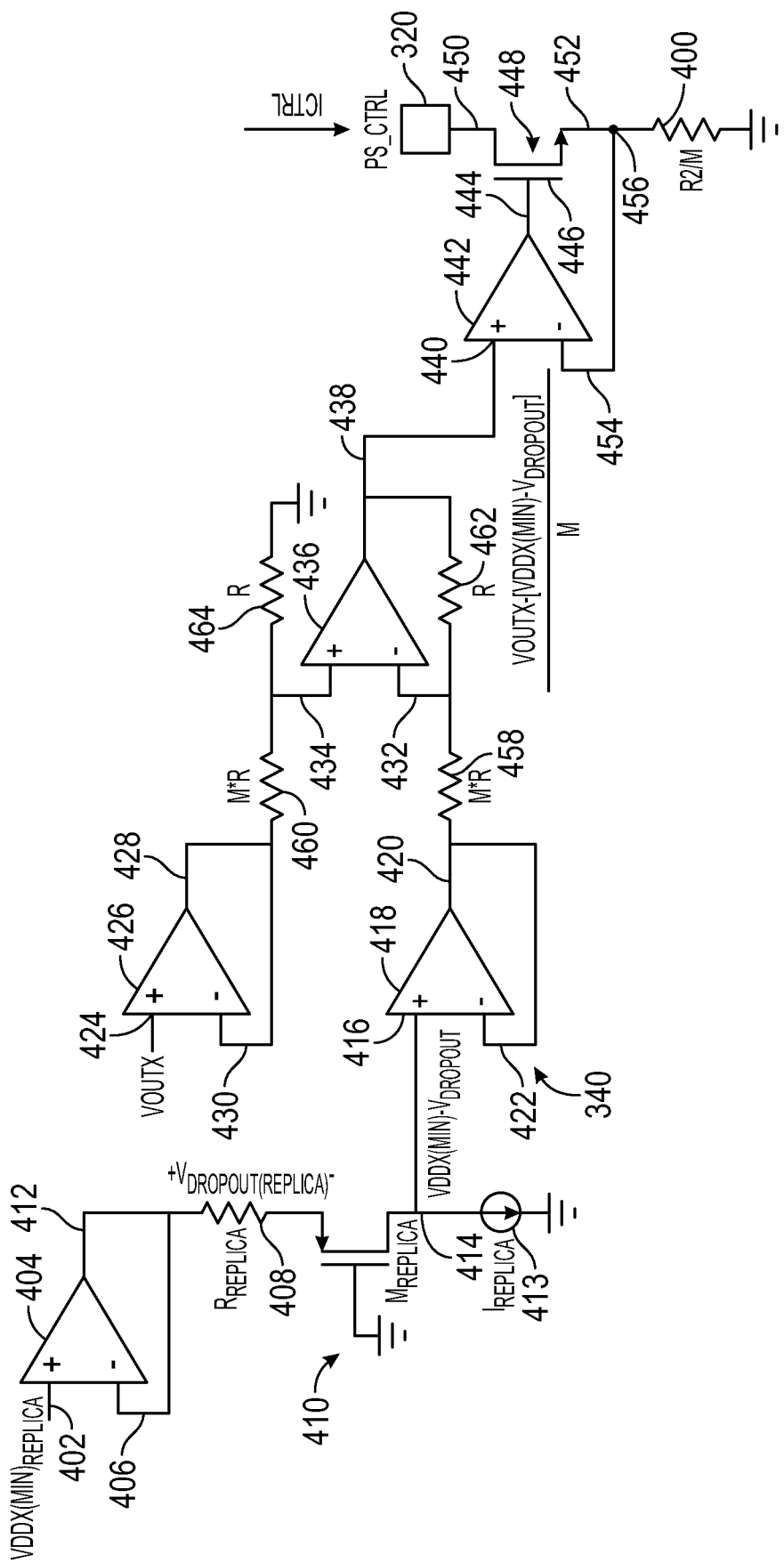
FIG. 4 illustrates a circuit for implementation of the power supply control current $I_{CTRL}$ for a current source DAC.

Such a circuit, to be used in a HEPSCL that takes as input $V_{DDX}$(MIN), $V_{OUTX}$ and $V_{DROPOUT}$(MIN) and outputs $I_{CTRL}$ current 340, can be implemented in a circuit of the type illustrated in FIG. 4 for a current source DAC 300 of the type illustrated in FIG. 3. For example, $V_{DDX}$(MIN) may be a constant voltage and may be generated using a circuit such as a bandgap voltage reference. On the other hand, $V_{DROPOUT}$(MIN) may be a voltage that can vary with process variations, temperature, and time and may be dynamically tracked by the HEPSCL. This can be achieved using a smaller scale replica (e.g., $\frac{1}{100}^{th}$) of the current source DAC 300 output circuit, specifically using smaller scale replicas of the resistor 134 and the P channel output FET 148. By placing this smaller scale replica in close physical proximity of the actual output circuit, variations due to process, temperature, physical stress and time can be tracked.

As illustrated in FIG. 4, resistor $R_{REPLICA}$ 408 can be used as a smaller scale replica of resistor 134 of the output circuit. Similarly the P channel FET $M_{REPLICA}$ 410 can be used as a smaller scale replica of the P channel output FET 148 of the output circuit. A replica of the $V_{DDX}$(MIN) voltage ($V_{DDX}$(MIN)$_{REPLICA}$), which can be generated from a bandgap voltage reference, can be applied to the non-inverting input 402 of differential amplifier 404. The output 412 of the differential amplifier 404 may be connected to the inverting input 406 to form a unity gain buffer. This unity gain buffer buffers the $V_{DDX}$(MIN)$_{REPLICA}$ voltage and allows it to drive the resistor $R_{REPLICA}$ 408 and the P channel FET $M_{REPLICA}$ 410, while also allowing the $V_{DDX}$(MIN)$_{REPLICA}$ voltage to remain constant. A first terminal of resistor $R_{REPLICA}$ 408 can be connected to the output 412 of the unity gain buffer 404 and a second terminal of resistor $R_{REPLICA}$ 408 can be connected to the source node of P channel FET $M_{REPLICA}$ 410. The drain node of the P channel FET $M_{REPLICA}$ 410 can be connected to a first terminal of current source $I_{REPLICA}$ 413 and the second terminal of the current source $I_{REPLICA}$ 413 can be connected to GROUND. This series connection of the resistor $R_{REPLICA}$ 408, P channel FET $M_{REPLICA}$ 410 and the current source $I_{REPLICA}$ 413 is a smaller scale replica (e.g., $\frac{1}{100}^{th}$) of the output circuit of the current source DAC 300, formed by resistor 134 and P channel output FET 148, biased at $I_{REPLICA}$ current which is a scaled down version of the high output current of the current source DAC 300. The gate node of P channel FET $M_{REPLICA}$ 410 may be connected to the most negative voltage in the circuit, in the case of FIG. 4 the GROUND node, since the minimum DC resistance of a P channel FET can be achieved when its gate is at the lowest voltage possible. In this configuration, the voltage drop across the resistor $R_{REPLICA}$ 408 and the P channel FET $M_{REPLICA}$ 410 or equivalently the voltage difference between output 412 and node 414, can be made substantially equal to the minimum dropout voltage requirement, $V_{DROPOUT}$(MIN), of the output circuit of the current source DAC 300 and can dynamically track the changes in $V_{DROPOUT}$(MIN) due to programmed DAC current, process variations, temperature, and time. This can be achieved when $I_{REPLICA}$ 413 is programmed using the same digital data (CODE) used to program the precision DAC 102. This method of programming results in $I_{REPLICA}$ 413 being a scaled down version of the high output current of the current source DAC 300, such that the resistor $R_{REPLICA}$ 408 and P channel FET $M_{REPLICA}$ 410 operate at the same current density as the resistor 134 and the P channel output FET 148 of the output circuit of the current source DAC 300. This method enables HEPSCL to track instantaneous changes in the minimum dropout voltage requirement of the current source DAC 300 in the presence of programmed DAC code changes, in addition to other changes such as process variation, voltage levels, temperature and time.

In the circuit of FIG. 4, the voltage at output 412 can be substantially equal to $V_{DDX}$(MIN) and the voltage difference between output 412 and node 414 can be substantially equal to $V_{DROPOUT}$(MIN). By Kirchhoff's voltage law, this results in voltage at node 414 to be substantially equal to $V_{DDX}$(MIN)–$V_{DROPOUT}$(MIN). Based on the equations for $I_{CTRL}$ that yield higher power efficiency operation, the voltage at node 414 may be subtracted from the output voltage $V_{OUTX}$ in order to generate $I_{CTRL}$. This can be achieved by using the buffered subtractor circuit formed by the differential amplifiers 426, 418, and 436 and the resistors 458, 460, 462 and 464. The amplifier 426 can be connected in a unity gain buffer configuration and buffers the output voltage $V_{OUTX}$ of the current source DAC 300. This results in node 428 being substantially equal to $V_{OUTX}$. In a similar fashion, the amplifier 418 can be connected in a unity gain buffer configuration and buffers the node 414. The node 420 thus can be substantially equal to node 414 which can be equal to $V_{DDX}$(MIN)–$V_{DROPOUT}$(MIN). The amplifier 436 and the resistors 458, 460, 462 and 464 form an attenuating subtractor, such that the output of amplifier 436 at node 438 can be substantially equal to $$\frac{VOUTX - [VDDX(MIN) - VDROPOUT(MIN)]}{M}.$$

The attenuating subtractor attenuates or divides the difference by M, which lowers the voltage swing on the node 438 by the same amount. M can be an integer greater than or equal to 5 to substantially attenuate the voltage swing on the node 438. This eases the design of the amplifier 436 since its output voltage swings much less using an attenuating subtractor.

The output stage of the circuit in FIG. 4 can be a transconductance stage that converts the voltage at node 438 into the current $I_{CTRL}$, utilizing the amplifier 442, N channel output FET 448 and resistor 400. $I_{CTRL}$ equals $$\frac{VOUTX - [VDDX(MIN) - VDROPOUT(MIN)]}{R2}$$

for higher power efficiency operation. This can be achieved by setting the resistance of resistor 400 to be equal to R2/M, since $I_{CTRL}$ is equal to the ratio of the voltage at node 438 to the resistance value of resistor 400.

The implementation of FIG. 4 takes as inputs $V_{DDX}$(MIN), $V_{OUTX}$ and $V_{DROPOUT}$(MIN) and generates $I_{CTRL}$ required for higher power efficiency operation. By coupling the PS_CTRL pin 320 that $I_{CTRL}$ flows through to the $V_{FB}$ pin and the voltage setting resistor network of a buck converter chip 310 that supplies the $V_{DDX}$ voltage, the HEPSCL can be implemented. It should be noted that the voltages $V_{OUTX}$ and $V_{DROPOUT}$(MIN) can be dynamically changing due to programmed DAC current, process variation, temperature, voltage levels or time, and the circuit implementation shown in FIG. 4 would allow a HEPSCL to track the changes in $V_{OUTX}$ and $V_{DROPOUT}$(MIN) and dynamically adjust $I_{CTRL}$, such that the current source DAC operates at a higher power efficiency compared to when $V_{DDX}$ is set as a constant voltage and no dynamic adjustment is made. It also should be noted that the implementation shown in FIG. 4 is one possible implementation of the $I_{CTRL}$ current transfer function. It will be apparent to those skilled in the art that different implementations can be utilized including but not limited analog current domain additions and subtractions, etc.

The approach implemented in FIG. 4 may be applied in the case where 2 or more current source DAC channels share one output circuit power supply pin $V_{DDX}$.

Figure 5:
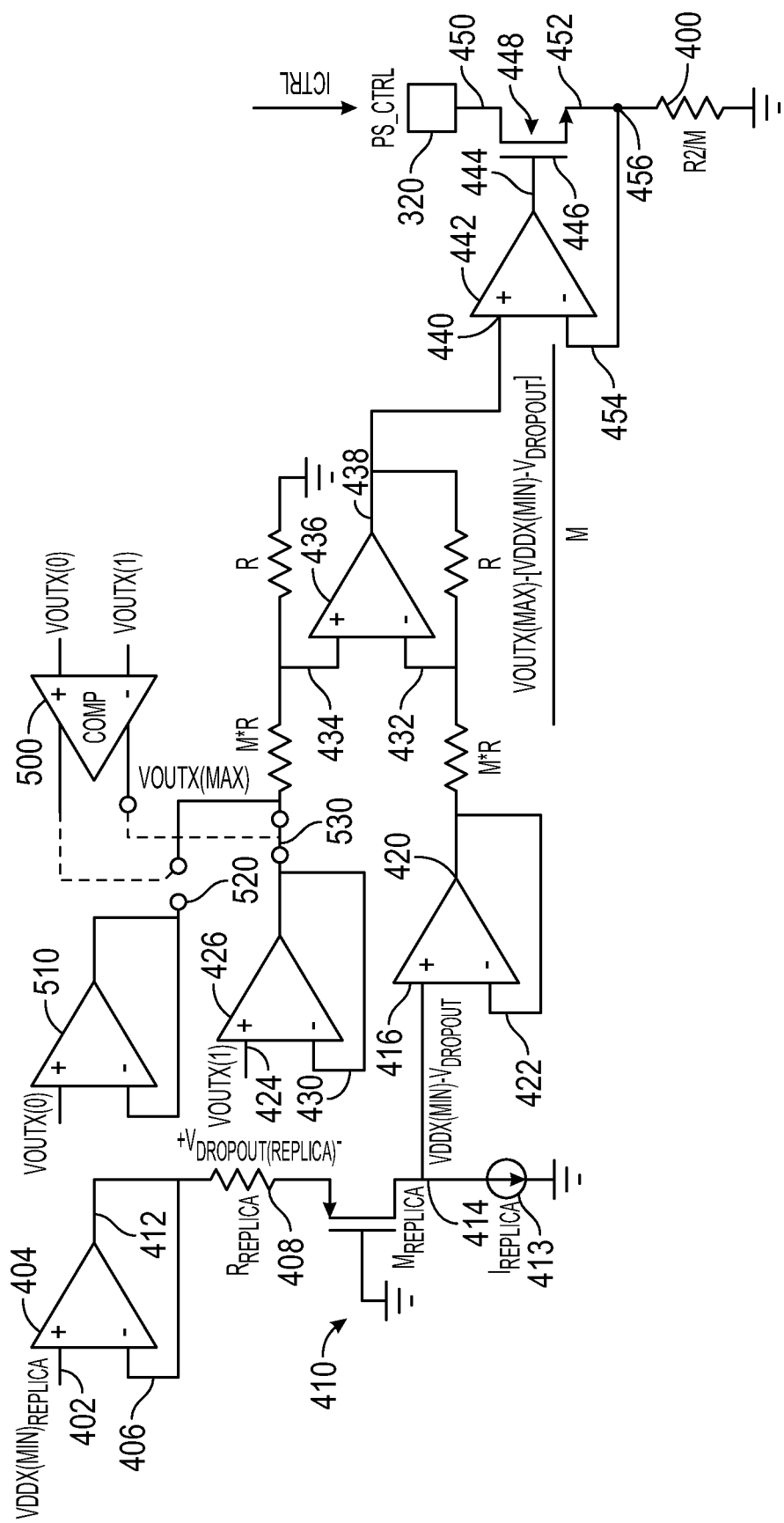
FIG. 5 illustrates a circuit for implementation of the power supply control current $I_{CTRL}$ when multiple DAC channels are connected to a single supply.

FIG. 5 illustrates an example including two current source DAC 300 channels on a single $V_{DDX}$ supply. In this case, an analog comparator 500 may determine the higher of the output voltages $V_{OUTX}$(MAX), amongst the two current source DAC 300 output voltages $V_{OUTX(0)}$, $V_{OUTX(1)}$, etc. and can force the $I_{CTRL}$ to track the higher $V_{OUTX}$ voltage by switching in the corresponding differential amplifier 426, 510, etc. using switches 520, 530. In this case, $V_{DDX}$ may be equal to $V_{OUTX}$(MAX)+$V_{DROPOUT}$(MIN) where $V_{OUTX}$(MAX) can be the output voltage of the current source DAC 300 channel with the higher voltage. Another option may be to assign one channel (for example the higher current channel of the current source DAC 300) to be the master and to use that channel to generate $I_{CTRL}$.

Certain applications can require that the power supply powering the current source DAC or the current sink DAC also power one or more additional circuits, including but not limited to, analog-to-digital converters, voltage references, and amplifiers. In some such applications, the minimum power supply voltage $V_{DDX}$(MIN) of the current source DAC can be too low to operate these additional circuits. In accordance with this disclosure, a user-programmable minimum voltage $V_{DDX}$(PROG) can be used instead of the minimum voltage $V_{DDX}$(MIN), such as described below with respect to FIG. 9.

Figure 9:
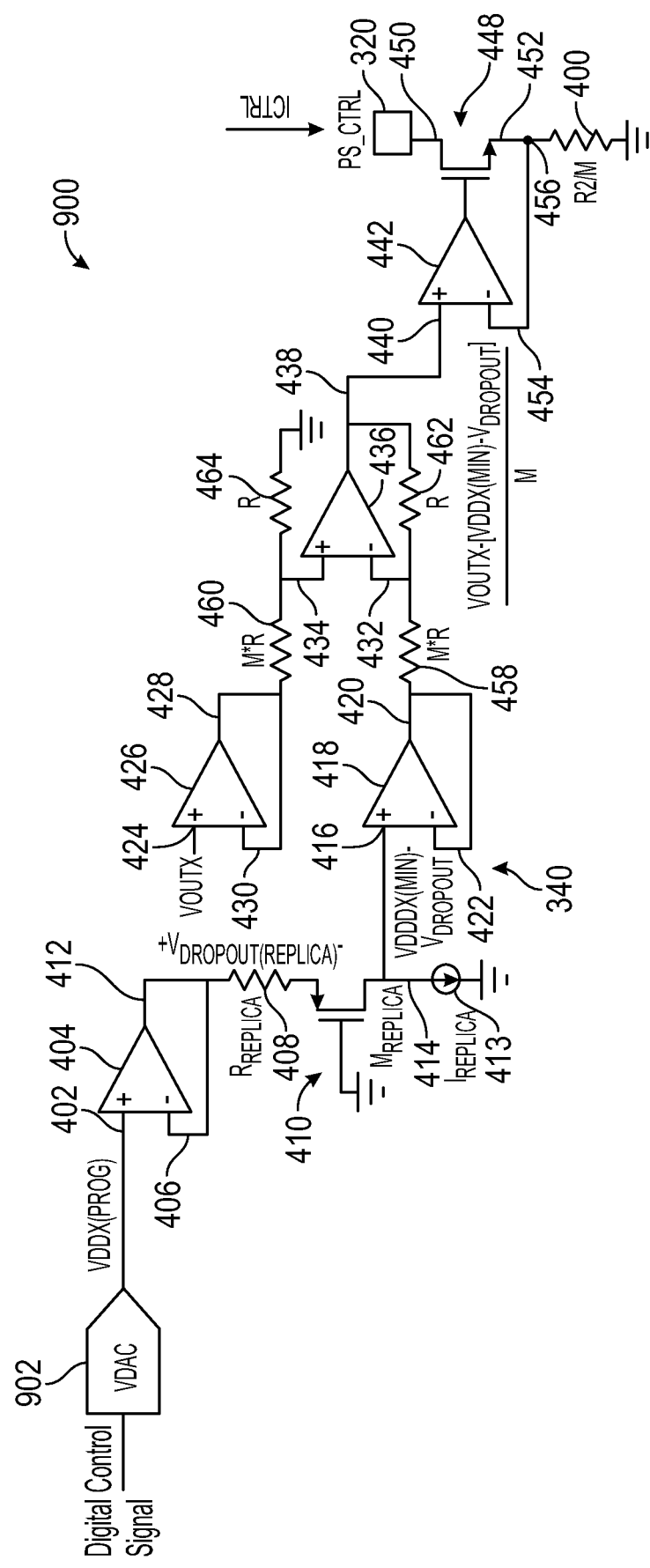
FIG. 9 illustrates another circuit for implementation of the power supply control current $I_{CTRL}$ for a current source DAC.

FIG. 9 illustrates another circuit for implementation of the power supply control current $I_{CTRL}$ for a current source DAC. Some of the components in FIG. 9 are similar to those in FIG. 4 and, for purposes of conciseness, will not be described again. The circuit 900 in FIG. 9 can include a voltage digital-to-analog converter (VDAC) 902 that is being controlled by a user-provided digital control signal, e.g., digital word. The VDAC 902 can generate the minimum power supply voltage $V_{DDX}$(PROG).

Each additional circuit that is powered by the same power supply as the current source DAC (or current sink DAC) can have a minimum supply voltage requirement. By programming the minimum power supply voltage $V_{DDX}$(PROG) to the highest of these minimum supply voltage requirements, the output voltage of the power supply can be made higher than $V_{DDX}$(PROG) voltage at all times, which can guarantee that all the minimum supply voltage requirements for the additional circuits are met. This can allow dynamic adjustment of the current source DAC power supply in the presence of the additional circuits, such that the current source DAC operates at a higher power efficiency compared to the case when no dynamic adjustment is made. It should be noted that the addition of the VDAC 900 in FIG. 9 can be applied to other circuits in this disclosure, such as the circuit shown in FIG. 5.

Figure 10:
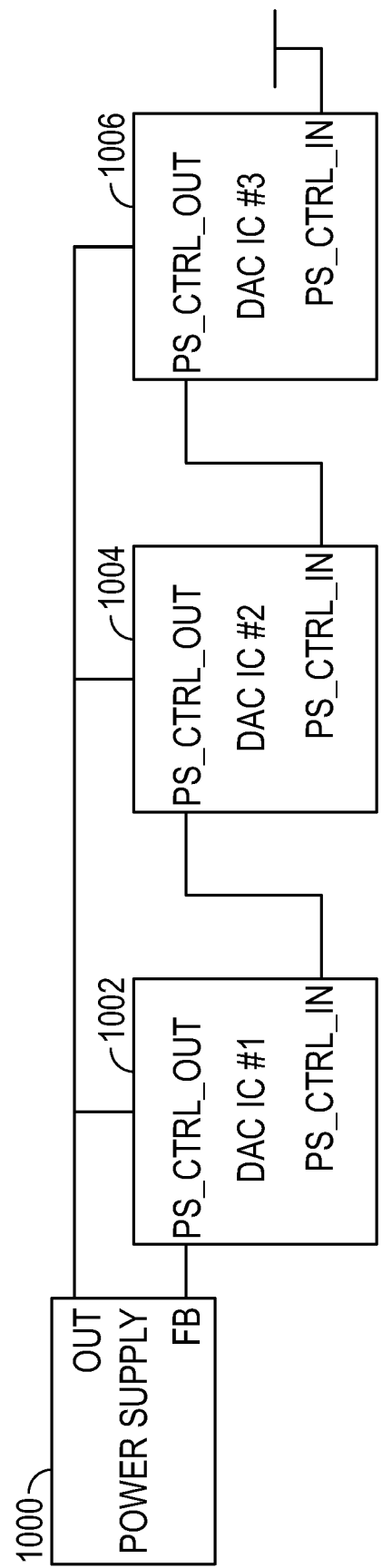
FIG. 10 is a block diagram illustrating a daisy chain connection of three current source DACs powered from the same power supply.

The approach implemented in FIG. 4 can be extended to implementations in which two or more current source DAC integrated circuits (ICs) are powered from the same power supply, such as shown in FIG. 10

FIG. 10 is a block diagram illustrating a daisy chain connection of three current source DACs powered from the same power supply. As seen in FIG. 10, a power supply 1000 can supply power to current source DAC 1002, current source DAC 1004, and current source DAC 1006. Although three current source DACs are depicted, these techniques are applicable to two current source DACs coupled to the same power supply 1000 or more than three current source DACs coupled to the same power supply 1000.

In the daisy chain configuration shown in FIG. 10, each current source DAC can include two additional pins, namely a power supply control output pin ("PS_CTRL_OUT") and a power supply control input pin ("PS_CTRL_IN"). The pin PS_CTRL_OUT can act similar to the PS_CTRL pin of FIG. 4.

In FIG. 10, there is only one current source DAC, namely DAC 1002, that has a PS_CTRL_OUT pin directly connected to the power supply feedback ("FB") node. The other current source DACs 1004, 1006 couple to each other and are able to communicate their needs to the current source DAC 1002 that is coupled to the power supply feedback node of the power supply. Each current source DAC in the chain can generate its own $I_{CTRL}$ current, as shown as described above with respect to FIG. 4. However, before outputting the $I_{CTRL}$ current to the PS_CTRL_OUT pin, the current source DAC, such as the current source DAC 1002, can compare the internally generated $I_{CTRL}$ current to the $I_{CTRL}$ current that may be present at the PS_CTRL_IN pin.

Figure 11:
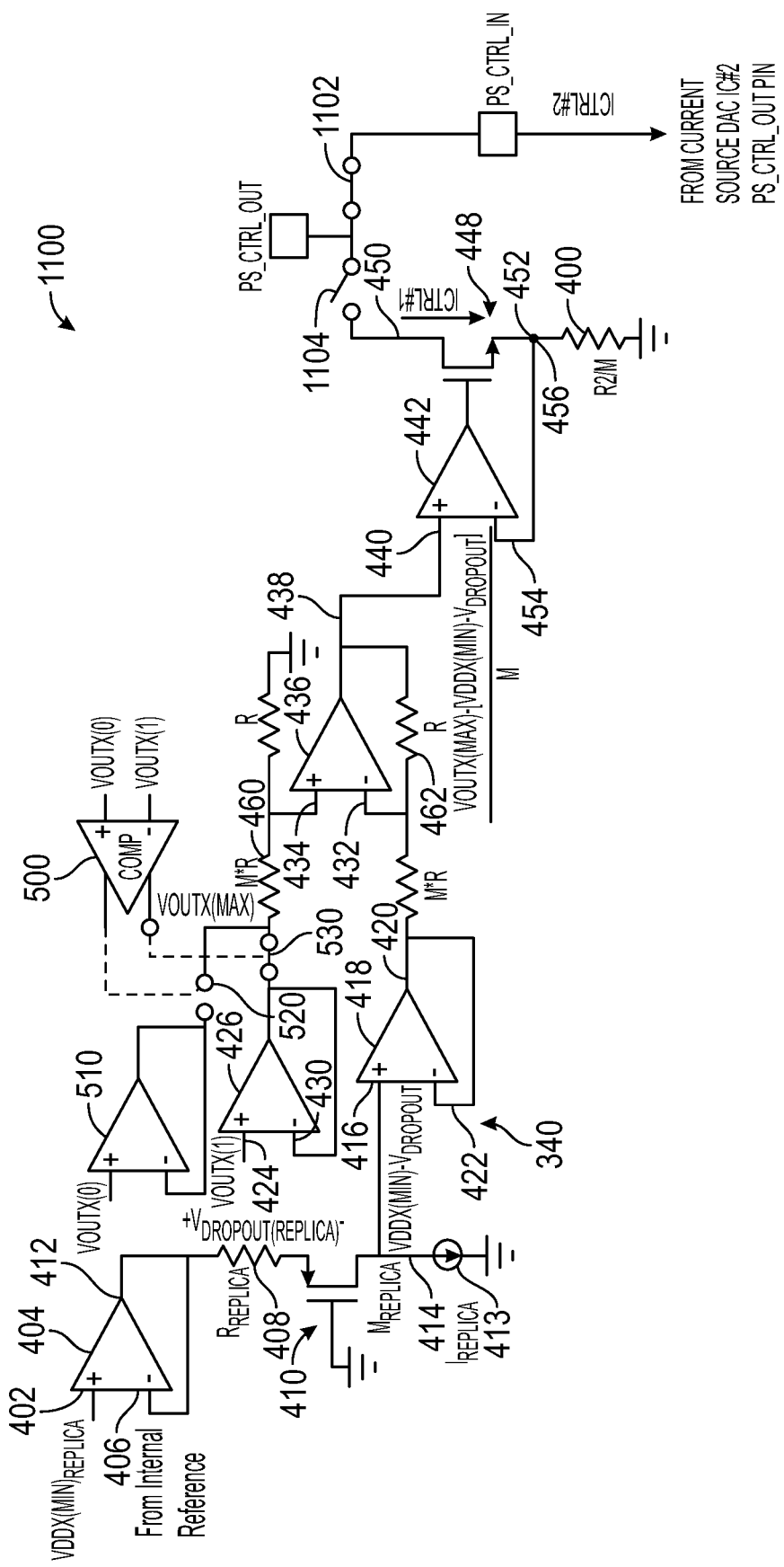
FIG. 11 illustrates a circuit for implementation of the power supply control current $I_{CTRL}$ for multiple current source DACs powered from the same power supply.

FIG. 11 illustrates a circuit for implementation of the power supply control current $I_{CTRL}$ for multiple current source DACs powered from the same power supply. Some of the components in FIG. 11 are similar to those in FIG. 5 and, for purposes of conciseness, will not be described again.

FIG. 11 shows the two pins PS_CTRL_OUT and PS_CTRL_IN for the current source DAC 1002 of FIG. 10, the current ICTRL #1 internally generated by the current source DAC 1002 of FIG. 10, and the current ICTRL #2 present at the PS_CTRL_IN pin of DAC 1002 of FIG. 10 that is received from the PS_CTRL_OUT pin of current source DAC 1004 of FIG. 10. The current source DAC can control a selection of the switches 1102, 1104 which can control selection of the higher of the two currents ICTRL #1 and ICTRL #2 to be output at the PS_CTRL_OUT pin. This can guarantee that the current source DAC with the highest current ICTRL and consequently the highest power supply voltage requirement, will control the power supply, thereby ensuring proper operation for all the current source DAC in the chain, such as in FIG. 10.

Post LDO for Ultra Low Noise Applications

A post LDO (Low Dropout) voltage regulator connected between the DC-DC voltage converter 305 and the current source DAC 600 may be desirable for some low noise applications. A post LDO voltage regulator may be provided to help attenuate or filter out the ripple noise of the DC-DC voltage converter 305 for ultra-low noise current source DAC 600 operation. Both the DC-DC voltage converter 305 and the LDO voltage regulator can optionally be controlled in tandem, where the output of the DC-DC voltage converter 305 and the output of the LDO voltage regulator dynamically increase or decrease by the same amount, such that the current source DAC 600 and the LDO voltage regulator operate more efficiently compared to the case where both the output of the DC-DC voltage converter and LDO voltage regulator are set as constant voltages and no dynamic adjustments are made.

Figure 6:
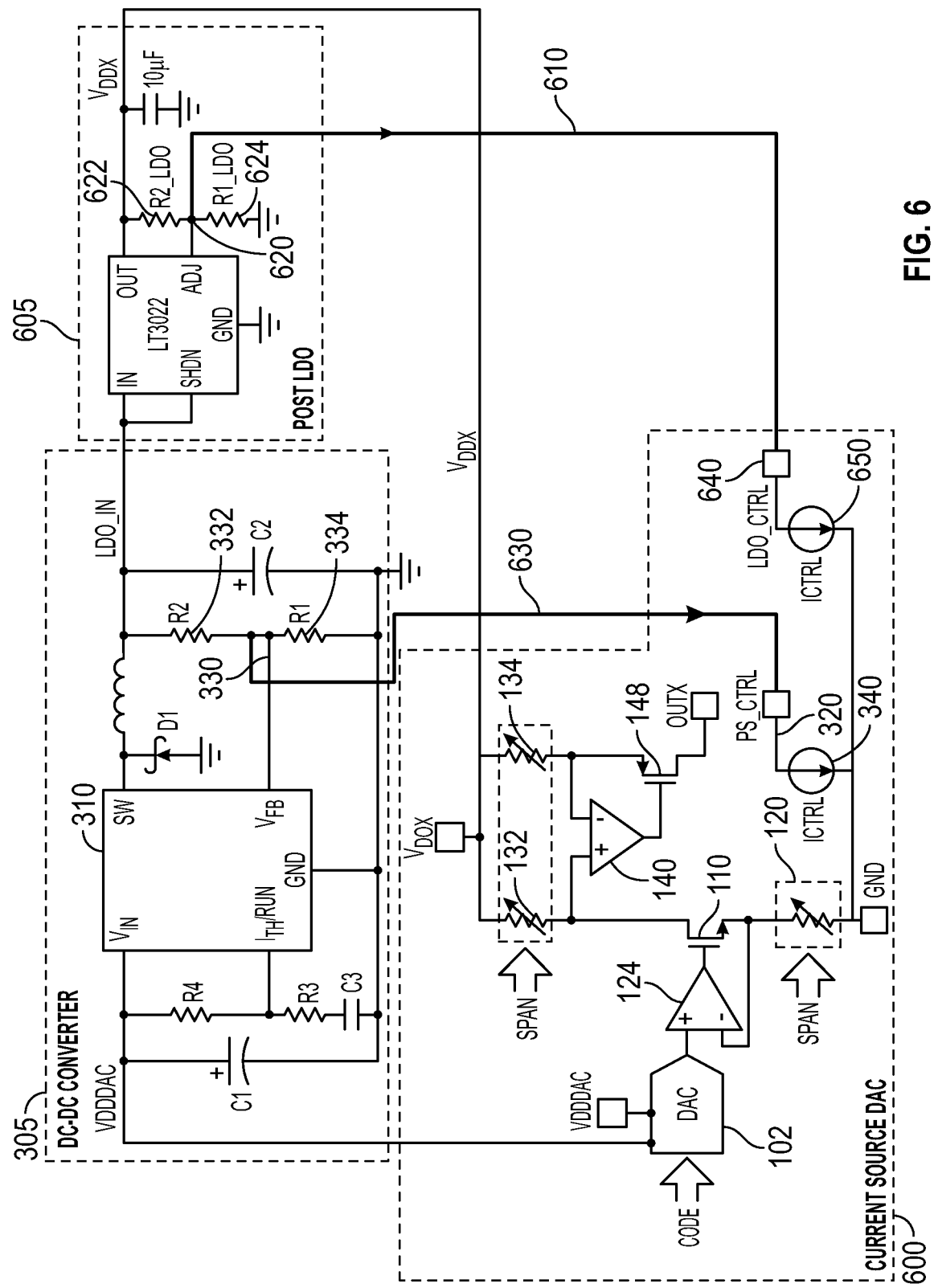
FIG. 6 illustrates a DC-DC voltage converter followed by a low dropout voltage regulator and a current source DAC that dynamically adjusts both the DC-DC voltage converter and the low dropout voltage regulator for higher power efficiency.

FIG. 6 illustrates a switch mode DC-DC voltage converter 305 followed by a post LDO voltage regulator 605. In FIG. 6, the post LDO voltage regulator 605 can include a voltage setting resistor network formed by LDO feedback resistor R2_LDO 622 and LDO termination resistor R1_LDO 624. The LDO voltage regulator 605 output $V_{DDX}$ which is the power supply for the output circuit of current source DAC 600 can be set by the voltage setting resistor network of resistors R2_LDO 622 and R1_LDO 624 and can be nominally equal to $(1+R2\_LDO/R1\_LDO) \cdot V_{ADJ}$, where $V_{ADJ}$ is the regulator specific adjustment voltage at node 620. In an example, resistors R2_LDO 622 and R1_LDO 624 can be selected such that $(1+R2\_LDO/R1\_LDO) \cdot V_{ADJ}=V_{DDX}$ (MIN) similar to the resistors R2 332 and R1 334 of FIG. 3. Also, the feedback resistor R2 332 and termination resistor R1 334 of the DC-DC converter 305 can then be set such that $(1+R2/R1) \cdot V_{FB}=V_{DDX}(MIN)+V_{DROPOUTLDO}(MIN)$, where $V_{DROPOUTLDO}(MIN)$ is the LDO regulator specific minimum dropout voltage requirement.

In order to be able to adjust the LDO voltage regulator 605 output $V_{DDX}$ and the DC-DC voltage converter 305 output LDO_IN by the same amount using the two identical copies of $I_{CTRL}$ current, the LDO feedback resistor 622 resistance value needs to be equal to the feedback resistor 322 resistance value of the DC-DC voltage converter 305, such that R2_LDO=R2. When these conditions are met, both the LDO voltage regulator 605 output $V_{DDX}$ and DC-DC voltage converter 305 output voltage LDO_IN may be controlled in tandem using two identical copies of the $I_{CTRL}$ current flowing through two separate pins PS_CTRL 320 and LDO_CTRL 640. A single $I_{CTRL}$ circuit similar to the implementation of FIG. 4, with two output transconductance stages, can be used to generate the two currents 340 and 650, and these two currents 340 and 650 can be coupled to nodes 330 and 620 respectively to form the HEPSCL. This implementation can help ensure that both the post LDO voltage regulator 605 and the current source DAC 600 operate at a higher power efficiency compared to the case where both the output of the DC-DC voltage converter and LDO voltage regulator are set as constant voltages.

Efficient Control of the DC-DC Voltage Converter for Current Sink DACs

In another configuration, a current sink DAC with a PS_CTRL pin may connect to the feedback (FB) node of an inverting DC-DC voltage converter. For a current sink DAC. PS_CTRL may be a current source output that regulates $V_{SSX}$ such that $$V_{SSX} = -1 \cdot \left(\frac{R2\_INV}{R1'\_INV}\right) \cdot V_{REF} - ICTRL \cdot R2\_INV,$$

where R2_INV 765 is the inverting feedback resistor and the R1'_INV 770 is the inverting termination resistor of the voltage setting resistor network of inverting DC-DC voltage converter 710 and VREF is the reference voltage of the inverting DC-DC voltage converter 710 (voltage at REF pin). The user sets $$-1 \cdot \left(\frac{R2\_INV}{R1'\_INV}\right) \cdot V_{REF} = VSSX(MAX)$$

so that VSSX=VSSX(MAX)−ICTRL·R2_INV. In this case, $V_{SSX}(MAX) \leq 0$ and is the maximum value of the negative supply voltage for proper current sink DAC operation.

Figure 7:
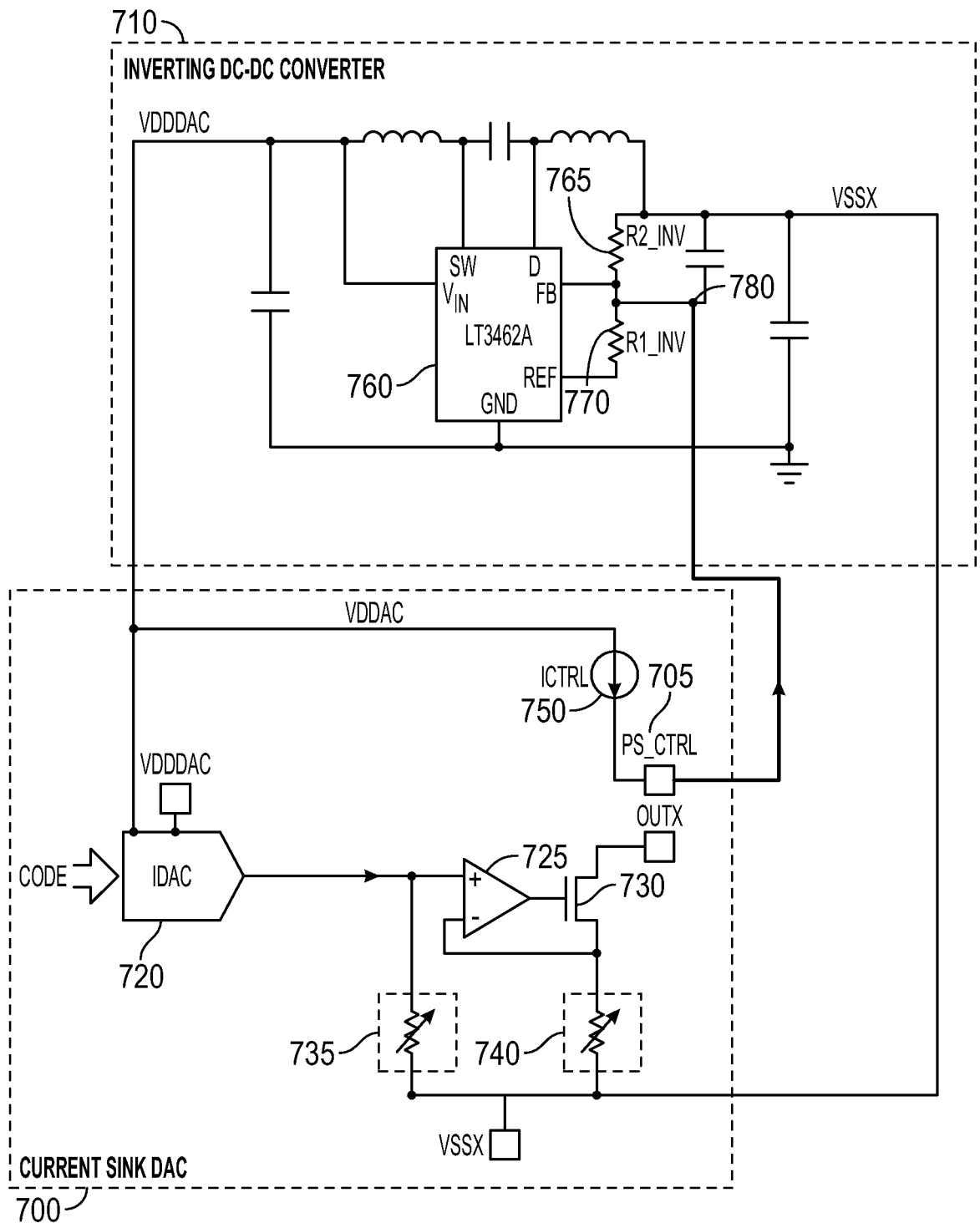
FIG. 7 illustrates a high efficiency current sink DAC.

FIG. 7 illustrates a current sink DAC 700 with a PS_CTRL pin 705 that can dynamically adjust the output voltage of an inverting DC-DC voltage converter 710, such that the current sink DAC 700 operates at a higher power efficiency compared to the case when the output of the inverting DC-DC voltage converter is set as a constant voltage and no dynamic adjustments are made. As illustrated in FIG. 7, the current sink DAC 700 can include a low power, precision current output DAC 720 and an output circuit including differential amplifier 725, N channel output FET 730, and variable resistors 735 and 740. The output circuit can have a dedicated power supply pin $V_{SSX}$ for the exclusive use of the output circuit. Similar to the current source DAC 100 case, the output circuit can be used to amplify the output current of the low power precision current output DAC 720 to a high output current that can be sunk (into the pin) through the OUTX pin. The variable resistors 735 and 740 can also be provided to change the gain of the output circuit similar to the current source DAC 100 of FIG. 2.

In this example, the $I_{CTRL}$ current source 750 can be connected between $VDD_{DAC}$ and the PS-CTRL pin 705 and can dynamically adjust the $V_{SSX}$ voltage such that the current sink DAC 700 operates at a higher power efficiency compared to the case when $V_{SSX}$ is set as a constant voltage. In the example of FIG. 7, an inverting DC-DC voltage converter 710 may be used. However, other types of DC-DC voltage converters, such as SEPIC or buck/boost can also be used. As illustrated in FIG. 7, the PS_CTRL pin 705 can be coupled to the FB pin of the inverting DC-DC converter chip 760 at node 780 of the voltage setting resistor network of resistors R2_INV (765) and R1_INV (770) to form a HEPSCL that can dynamically adjust the $V_{SSX}$ voltage when $V_{OUTX}$ and $V_{DROPOUT}(MIN)$ vary due to programmed DAC code, process variation, temperature, voltage levels, and time.

Similar to the current source DAC 100 case, the lower power dissipation and higher power efficiency may be achieved when $V_{SSX}$ is set to the lower of the two voltages $V_{SSX}(MAX)$ and $V_{OUTX}-V_{DROPOUT}(MIN)$, or equivalently $V_{SSX}=\min\{V_{SSX}(MAX), V_{OUTX}-V_{DROPOUT}(MIN)\}$, where $V_{SSX}(MAX)$ is the highest $V_{SSX}$ voltage that allows functional current sink DAC 700 operation and $V_{DROPOUT}(MIN)$ is the minimum dropout voltage requirement of the current sink DAC 700. Then, to achieve the higher power efficiency while guaranteeing proper current sink DAC 700 operation, $I_{CTRL}$ can be set as follows:

$$ICTRL = \begin{cases} 0, & \text{for } VOUTX > VSSX(MAX) + V_{DROPOUT}(MIN) \\ \dfrac{[VSSX(MAX) + V_{DROPOUT}(MIN)] - VOUTX}{R2\_INV}, & \text{for } VOUTX \leq VSSX(MAX) + V_{DROPOUT}(MIN) \end{cases}$$

Figure 8:
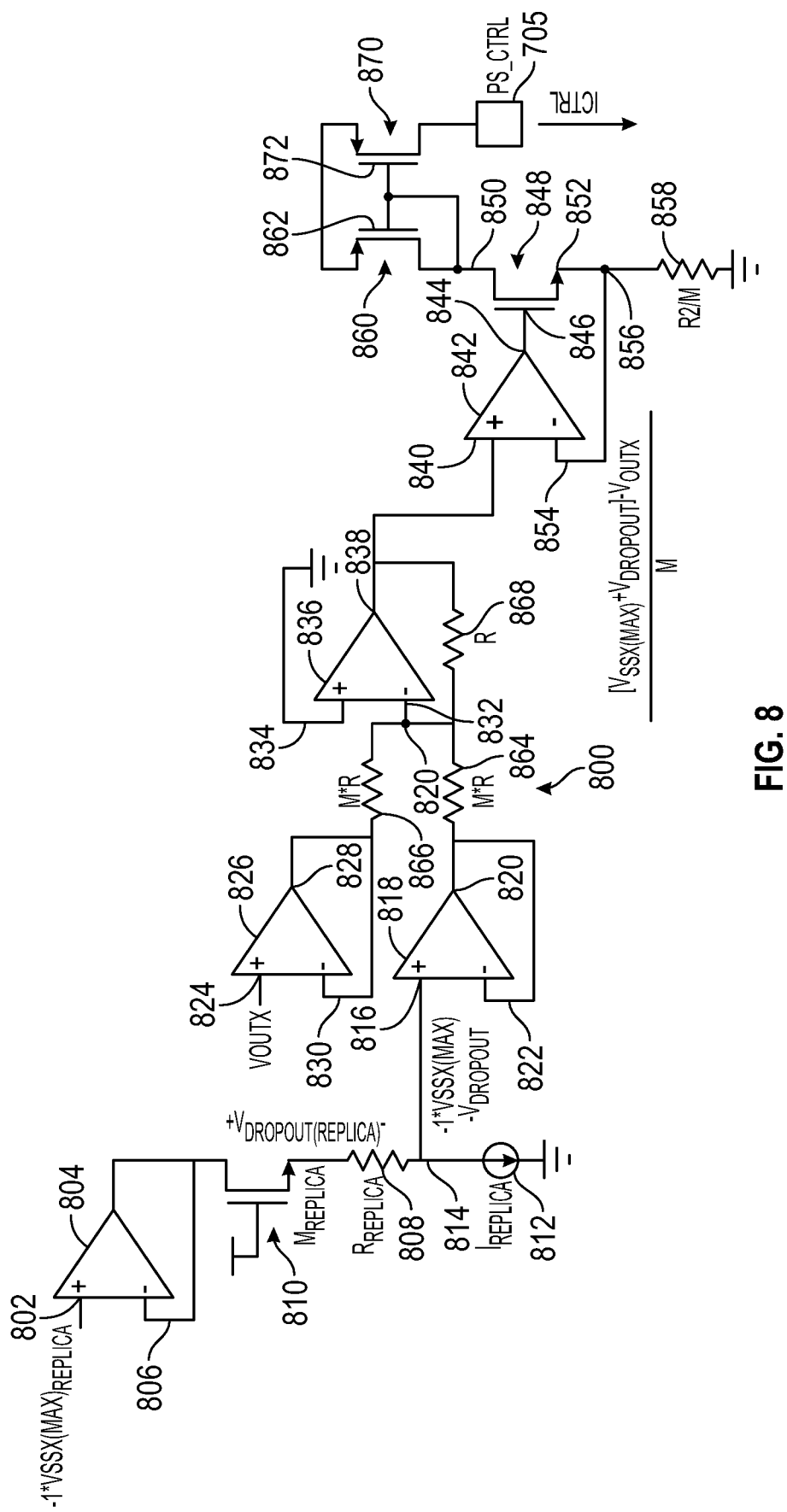
FIG. 8 illustrates a circuit for implementing the power supply control current $I_{CTRL}$ for a current sink DAC.

-continued $$VSSX = \begin{cases} VSSX(MAX), & \text{for } VOUTX > VSSX(MAX) + V_{DROPOUT}(MIN) \\ VOUTX - V_{DROPOUT}(MIN), & \text{for } VOUTX \leq VSSX(MAX) + V_{DROPOUT}(MIN) \end{cases}$$

then, $I_{CTRL}$ also may be implemented for a current sink DAC 700. For example, FIG. 8 illustrates a circuit for implementing the current control signal $I_{CTRL}$ for a current sink DAC 700, to be used in a HEPSCL that takes as input $V_{SSX}$(MAX), $V_{OUTX}$ and $V_{DROPOUT}$(MIN) and outputs $I_{CTRL}$ current. For example, $V_{SSX}$(MAX) is a constant voltage and may be generated using a circuit such as a bandgap voltage reference. On the other hand, $V_{DROPOUT}$(MIN) is a voltage that can vary with process variations, temperature and time and may be dynamically tracked by the HEPSCL. Similar to the current source DAC 100 case, this can be achieved by using a smaller scale (e.g., $\frac{1}{100}^{th}$) replica of the current sink DAC 700 output circuit, specifically using smaller scale replicas of the resistor 740 and the N channel output FET 730.

As illustrated in FIG. 8, resistor $R_{REPLICA}$ 808 may be used as a smaller scale replica of resistor 740 of the output circuit. Similarly, the N channel FET $M_{REPLICA}$ 810 may be used as a smaller scale replica of the N channel output FET 730 of the output circuit. A replica of the $-1 \cdot V_{SSX}$(MAX) voltage may be applied to the non-inverting input 802 of differential amplifier 804. The differential amplifier 804 may be connected in a unity gain buffer configuration. This unity gain buffer 804 buffers the $-1 \cdot V_{SSX}$(MAX)$_{REPLICA}$ voltage and allows it to drive the N channel FET $M_{REPLICA}$ 810 and the resistor $R_{REPLICA}$ 808, while also allowing the $-1 \cdot V_{SSX}$(MAX)$_{REPLICA}$ voltage to remain substantially constant. The drain node of the N channel FET $M_{REPLICA}$ 810 may be connected to the output of the unity gain buffer formed by amplifier 804. The source node of the N channel FET $M_{REPLICA}$ 810 may be connected to a first terminal of resistor $R_{REPLICA}$ 808 and a second terminal of the resistor $R_{REPLICA}$ 808 may be connected to a first terminal of the current source $I_{REPLICA}$ 812. The second terminal of the current source $I_{REPLICA}$ 812 may be connected to GROUND. This series connection of the N channel FET $M_{REPLICA}$ 810, the resistor $R_{REPLICA}$ 808, and the current source $I_{REPLICA}$ 812 is a smaller scale replica (e.g., $\frac{1}{100}^{th}$) of the output circuit of the current sink DAC 700, formed by resistor 740 and the N channel output FET 730, biased by $I_{REPLICA}$ current which is a scaled down version of the high output current of the current sink DAC 700. The gate node of the N channel FET $M_{REPLICA}$ 810 may be connected to the most positive voltage in the circuit since the minimum DC resistance of an N channel FET may be achieved when its gate is at the highest voltage possible.

In this configuration, the voltage drop across the N channel FET $M_{REPLICA}$ 810 and the resistor $R_{REPLICA}$ 808 or equivalently the voltage difference between nodes 806 and 814, can be made substantially equal to the minimum dropout voltage requirement, $V_{DROPOUT}$(MIN) of the output circuit of the current sink DAC 700, and can dynamically track the changes in $V_{DROPOUT}$(MIN) due to programmed DAC current, process variations, temperature and time. This may be achieved when $I_{REPLICA}$ 812 is programmed to be a scaled down version of the high output current of the current sink DAC 700, such that the resistor $R_{REPLICA}$ 808 and the N channel FET $M_{REPLICA}$ 810 operate at the same current density as the resistor 740 and the N channel output FET 730 of the output circuit of the current sink DAC 700.

As mentioned before, in the circuit of FIG. 8, the voltage at node 806 may be substantially equal to $-1 \cdot V_{SSX}$(MAX) and the voltage difference between nodes 806 and 814 may be substantially equal to $V_{DROPOUT}$(MIN). By Kirchhoff's voltage law, this results in voltage at node 814 to be substantially equal to $-1 \cdot V_{SSX}$(MAX)$-V_{DROPOUT}$(MIN). Based on the equations for $I_{CTRL}$ that yield higher power efficiency operation, this voltage at node 814 can be added to $V_{OUTX}$ and then the sum inverted in order to generate $I_{CTRL}$. This can be achieved by using the inverting, attenuating adder circuit formed by the differential amplifiers 826, 818, and 836 and the resistors 864, 866, and 868. The amplifier 826 may be connected in a unity gain buffer configuration and buffers the output voltage $V_{OUTX}$ of the current sink DAC 700. This results in node 828 being substantially equal to $V_{OUTX}$. In a similar fashion, the amplifier 818 may be connected in a unity gain buffer configuration and buffers the node 814. The node 820 may be substantially equal to node 814 which may be equal to $-1 \cdot V_{SSX}$(MAX)$-V_{DROPOUT}$(MIN). The amplifier 836 and the resistors 864, 866, and 868 form an inverting, attenuating adder, such that the output of amplifier 836 at node 838 is substantially equal to $$\frac{[VSSX(MAX) + VDROPOUT(MIN)] - VOUTX}{M}.$$

The inverting, attenuating adder attenuates or divides the sum voltage by M, which lowers the voltage swing on the node 838 by the same amount. M can be an integer greater than or equal to 5, to substantially attenuate the voltage swing on the node 838. This eases the design of the amplifier 836 since its output voltage swings much less using an inverting, attenuating adder.

The output stage of the circuit in FIG. 8 may be a transconductance stage followed by a current mirror that converts the voltage at node 838 into the current $I_{CTRL}$, and then mirrors it, such that the current $I_{CTRL}$ is sourced. The amplifier 842, N channel output FET 848, resistor 858 and the current mirror devices 860 and 870 form the output stage. $I_{CTRL}$ may be adjusted to equal $$\frac{[VSSX(MAX) + VDROPOUT(MIN)] - VOUTX}{R2\_INV}$$

for higher power efficiency operation. This can be achieved by setting the resistance of resistor 858 to be equal to R2_INV/M, since $I_{CTRL}$ is equal to the ratio of the voltage at node 838 to the resistance value of resistor 858. The implementation of FIG. 8 takes as inputs $-1 \cdot V_{SSX}$(MAX), $V_{OUTX}$ and $V_{DROPOUT}$(MIN) and generates $I_{CTRL}$ required for higher power efficiency operation. By coupling the PS_CTRL pin 705 that $I_{CTRL}$ flows through to the FB pin and the voltage setting resistor network of an inverting DC-DC converter chip 760 that supplies the $V_{SSX}$ voltage, the HEPSCL can be implemented. It should be noted that the voltages $V_{OUTX}$ and $V_{DROPOUT}$(MIN) can be dynamically changing due to programmed DAC current, process variation, temperature, voltage levels or time, and the circuit implementation shown in FIG. 8 would allow a HEPSCL to track the changes in $V_{OUTX}$ and $V_{DROPOUT}$(MIN) and dynamically adjust $I_{CTRL}$, such that the current sink DAC 700 operates at a higher power efficiency compared to the case when $V_{SSX}$ voltage is set as a constant voltage.

Though a step-down buck DC-DC converter was used for $V_{DDX}$ in the current source DAC 100 case, the DC-DC converter described herein may be implemented not only as a buck DC-DC converter but also as a buck/boost, and boost. For the current sink DAC 700 case an inverting DC-DC converter was used but a single-ended primary-inductor converter (SEPIC) or a buck/boost type DC-DC converter may also be used. Also, as described with respect to FIG. 5, multiple DAC channels with a single power supply may be used; however, only the channel with the higher voltage will operate at the higher power efficiency.

The control current that modulates the power supply can be a sub-circuit of the current source DAC or can be built using external components. As a result, the HEPSCL described herein may be applied to existing current source/sink DACs and can be fabricated on the same silicon chip as the current source/sink DACs or can be implemented as an external circuit for controlling the power supply. The HEPSCL also may be applied to a current source/sink DAC with a built-in DC-DC converter such that the DC-DC converter is controlled using the control current ($I_{CTRL}$). Also, as described with respect to FIG. 6, the HEPSCL may be applied to a current source/sink DAC with a post LDO following the DC-DC converter such that the DC-DC converter and post LDO are controlled in tandem by identical control currents ($I_{CTRL}$).

In addition to applications for optical component biasing (e.g., in fiber modules for lasers), the circuits described herein may be used to control electromagnetic mirrors for LIDAR applications, as well as to control thermoelectric coolers for biosensors. These and other applications will become apparent to those skilled in the art based on this description.

ADDITIONAL DESCRIPTION AND ASPECTS

Aspect 1 can include subject matter (such as a current source DAC) comprising at least one of a current source or a current sink digital-to-analog converter comprising a digital-to-analog converter circuit that converts a digital code to an analog current output, an output circuit that amplifies the analog current output of the digital-to-analog converter circuit to set a desired high current output for application to an output of the at least one current source or current sink digital-to-analog converter, and a power supply circuit that supplies power to the output circuit and a power supply control current to the at least one current source or current sink digital-to-analog converter to adjust an output of the power supply circuit in response to a variation in at least one of an output of the output circuit or a minimum dropout voltage requirement of the output circuit. Advantageously, power efficiency of the at least one current source or current sink digital-to-analog converter can be increased, such as compared to when an output of the power supply circuit is set as a constant voltage and no adjustment is made.

In Aspect 2, the subject matter of Aspect 1 optionally includes the digital-to-analog converter circuit comprising a digital-to-analog converter that provides an analog voltage output and a transconductance circuit, the transconductance circuit converting the analog voltage output to the analog current output of the digital-to-analog converter circuit.

In Aspect 3, the subject matter of Aspects 1 and/or 2 optionally includes a control pin on the current source or current sink digital-to-analog converter that is connected to the power supply control current and is adapted for coupling to the power supply circuit, the power supply control current adjusting the output of the power supply circuit in response to a change in an output voltage of the current source or current sink digital-to-analog converter.

In Aspect 4, the subject matter of one or any combination of Aspects 1-3 optionally includes the power supply control current adjusting the output of the power supply circuit in response to a change in a minimum dropout voltage requirement of the output circuit of the at least one current source or current sink digital-to-analog converter.

In Aspect 5, the subject matter of one or any combination of Aspects 1-4 optionally includes the power supply control current adjusting the output of the power supply circuit in response to a minimum or maximum power supply voltage requirement of the output circuit of the at least one current source or current sink digital-to-analog converter.

In Aspect 6, the subject matter of one or any combination of Aspects 1-5 optionally includes a current control signal circuit that generates the power supply control current, the current control signal circuit comprising a smaller scale replica of the output circuit of the at least one current source or current sink digital-to-analog converter that determines the minimum dropout voltage requirement of the output circuit.

In Aspect 7, the subject matter of one or any combination of Aspects 1-6 optionally includes the smaller scale replica of the output circuit being biased using a current generator that is programmed using the digital code such that the smaller scale replica of the output circuit operates at a same current density as the output circuit of the at least one current source or current sink digital-to-analog converter.

In Aspect 8, the subject matter of one or any combination of Aspects 1-7 where the minimum or maximum power supply voltage requirement of the output circuit is determined by utilizing a bandgap voltage reference.

In Aspect 9, the subject matter of one or any combination of Aspects 1-8 optionally includes the power supply circuit comprising a DC-DC voltage converter, a voltage setting resistor network, and a feedback pin to set an output voltage of the DC-DC voltage converter, the voltage setting resistor network comprising a feedback resistor with a first terminal coupled to the output voltage of the DC-DC voltage converter and a second terminal coupled to the feedback pin, the voltage setting resistor network further comprising a termination resistor with a first terminal coupled to the feedback pin and a second terminal coupled to a substantially constant reference voltage, the DC-DC voltage converter supplying power to the output circuit of a current source digital-to-analog converter, the current source digital-to-analog converter comprising a control pin that is coupled to the feedback pin, the power supply control current being sunk through the control pin, and the current source digital-to-analog converter adjusting the output voltage of the DC-DC voltage converter by adjusting the power supply control current.

In Aspect 10, the subject matter of one or any combination of Aspects 1-9 optionally includes resistance values of the feedback resistor and the termination resistor of the voltage setting resistor network of the DC-DC voltage converter being chosen such that a sum of (1) a feedback voltage of the DC-DC voltage converter and (2) a ratio of a resistance of the feedback resistor and a resistance of the termination resistor multiplied by the feedback voltage of the DC-DC voltage converter is equal to a minimum required supply voltage for the output circuit of the current source digital-to-analog converter.

In Aspect 11, the subject matter of one or any combination of Aspects 1-10 optionally includes the current source digital-to-analog converter adjusting an output of the power supply circuit in response to a variation in at least one of an output of the output circuit or a minimum dropout voltage requirement of the output circuit by utilizing a power supply control loop that accepts at a first input the output voltage of the current source digital-to-analog converter ($V_{OUTX}$), at a second input a minimum required supply voltage for the output circuit of the current source digital-to-analog converter ($V_{DDX}(MIN)$), and at a third input a minimum dropout voltage requirement of the output circuit of the current source digital-to-analog converter ($V_{DROPOUT}(MIN)$), the power supply control loop outputting the power supply control current, the power supply control current having a value of zero when $V_{OUTX}$ is less than a difference between $V_{DDX}(MIN)$ and $V_{DROPOUT}(MIN)$ and otherwise having a value that is a function of a resistance of the feedback resistor of the voltage setting resistor network of the DC-DC converter and a difference between $V_{OUTX}$ and the difference between $V_{DDX}(MIN)$ and $V_{DROPOUT}(MIN)$:

In Aspect 12, the subject matter of one or any combination of Aspects 1-11 optionally includes a current source digital-to-analog converter comprising a plurality of output channels, two or more of the output channels sharing a power supply circuit that supplies power to the output circuit of the two or more current source digital-to-analog converter output channels, the current source digital-to-analog converter further comprising an analog voltage comparator that determines a current source digital-to-analog converter output channel with a higher output voltage at any given time amongst the two or more of the current source digital-to-analog converter output channels sharing the power supply circuit and that selects an output channel voltage to be processed by the power supply control loop to generate the power supply control current that is used to adjust the output voltage of the power supply circuit.

In Aspect 13, the subject matter of one or any combination of Aspects 1-12 optionally includes a current source digital-to-analog converter comprising a plurality of output channels, two or more of the output channels sharing a power supply circuit that supplies power to the output circuit of the two or more current source digital-to-analog converter output channels, where one of the two or more output channels share a power supply circuit that is determined to be a master output channel, the master output channel voltage being selected to be processed by the power supply control loop to generate the power supply control current that is used to adjust the output voltage of the power supply circuit.

In Aspect 14, the subject matter of one or any combination of Aspects 1-13 optionally includes a low dropout (LDO) voltage regulator between the power supply circuit and the at least one current source or current sink digital-to-analog converter, the LDO voltage regulator filtering the noise of the power supply circuit.

In Aspect 15, the subject matter of one or any combination of Aspects 1-14 optionally includes the LDO voltage regulator comprising an LDO voltage setting resistor network and a voltage adjust pin to set an output voltage of the LDO voltage regulator, LDO voltage setting resistor network comprising an LDO feedback resistor with a first terminal coupled to an output voltage of the LDO voltage regulator and a second terminal coupled to the voltage adjust pin of the LDO voltage regulator, the LDO voltage setting resistor network further comprising an LDO termination resistor with a first terminal coupled to the voltage adjust pin of the LDO voltage regulator and a second terminal coupled to a substantially constant reference voltage, the LDO voltage regulator supplying power to an output circuit of a current source digital-to-analog converter, and the current source digital-to-analog converter comprising an LDO control pin that is coupled to the voltage adjust pin of the LDO voltage regulator, the current source digital-to-analog converter further comprising an LDO power supply control current that is substantially equal to the power supply control current of the current source digital-to-analog converter that is sunk through the LDO control pin such that the current source digital-to-analog converter can adjust the output voltage of the LDO voltage regulator by adjusting the LDO power supply control current.

In Aspect 16, the subject matter of one or any combination of Aspects 1-15 optionally includes resistance values of the LDO feedback resistor and the LDO termination resistor of the LDO voltage setting resistor network of the LDO voltage regulator being chosen such that a sum of (1) a voltage at the voltage adjust pin of the LDO voltage regulator and (2) a ratio of a resistance of the LDO feedback resistor and a resistance of the LDO termination resistor multiplied by the voltage at the voltage adjust pin of the LDO voltage regulator is equal to a minimum required supply voltage for the output circuit of the current source digital-to-analog converter.

In Aspect 17, the subject matter of one or any combination Aspects 1-16 optionally includes the power supply circuit supplying power to the LDO voltage regulator comprising a DC-DC voltage converter, an output voltage of the DC-DC voltage converter being adjusted by a current source digital-to-analog converter comprising the power supply control current, the DC-DC voltage converter comprising a voltage setting resistor network and a feedback pin to set the output voltage of the DC-DC voltage converter, the voltage setting resistor network comprising a feedback resistor with a first terminal coupled to the output voltage of the DC-DC voltage converter and a second terminal coupled to the feedback pin, the voltage setting resistor network further comprising a termination resistor with a first terminal coupled to the feedback pin and a second terminal coupled to a substantially constant reference voltage, resistance values of the feedback resistor and the termination resistor of the voltage setting resistor network of the DC-DC voltage convertor being chosen such that a resistance of the feedback resistor and a resistance of the LDO feedback resistor are substantially equal and a sum of (1) a feedback voltage of the DC-DC voltage converter and (2) a ratio of a resistance of the feedback resistor and a resistance of the termination resistor multiplied by the feedback voltage of the DC-DC voltage converter is equal to a sum of a minimum required supply voltage for the output circuit of the current source digital-to-analog converter and a minimum dropout voltage requirement of the LDO voltage regulator.

In Aspect 18, the subject matter of one or any combination of Aspects 1-17 optionally includes the power supply circuit comprising an inverting DC-DC voltage converter that generates a negative voltage with respect to a ground voltage, the inverting DC-DC voltage converter comprising a voltage setting resistor network, a feedback pin, and a reference pin to set an output voltage of the inverting DC-DC voltage converter, the voltage setting resistor network comprising an inverting feedback resistor with a first terminal coupled to the output voltage of the inverting DC-DC voltage converter and a second terminal coupled to the feedback pin, the voltage setting resistor network further comprising an inverting termination resistor with a first terminal coupled to the feedback pin and a second terminal coupled to the reference pin, the inverting DC-DC voltage converter supplying power to an output circuit of a current sink digital-to-analog converter, the current sink digital-to-analog converter comprising a control pin that is coupled to the feedback pin of the inverting DC-DC voltage converter, and the current sink digital-to-analog converter further comprising the power supply control current being sourced through the control pin such that the current sink digital-to-analog converter can adjust the output voltage of the inverting DC-DC voltage converter by adjusting the power supply control current.

In Aspect 19, the subject matter of one or any combination of Aspects 1-18 optionally includes resistance values of the inverting feedback resistor and the inverting termination resistor of the voltage setting resistor network of the inverting DC-DC voltage converter being chosen such that a ratio of a resistance of the inverting feedback resistor and a resistance of the inverting termination resistor multiplied by a voltage at the reference pin of the inverting DC-DC voltage converter is a value having a magnitude that is a negative of a maximum allowed value of the negative supply voltage for the output circuit of the current sink digital-to-analog converter.

In Aspect 20, the subject matter of one or any combination of Aspects 1-19 optionally includes the current sink digital-to-analog converter adjusting an output of the power supply circuit in response to a variation in at least one of an output of the output circuit or a minimum dropout voltage requirement of the output circuit by utilizing a power supply control loop that accepts at a first input the output voltage of the current sink digital-to-analog converter ($V_{OUTX}$), at a second input a maximum allowed value of the negative supply voltage for the output circuit of the current sink digital-to-analog converter ($V_{SSX}(MAX)$), and at a third input a minimum dropout voltage requirement of the output circuit of the current sink digital-to-analog converter ($V_{DROPOUT}(MIN)$), the power supply control loop outputting the power supply control current, the power supply control current having a value of zero when $V_{OUTX}$ is greater than a sum of $V_{SSX}(MAX)$ and $V_{DROPOUT}(MIN)$ and otherwise having a value that is a function of a resistance of the inverting feedback resistor of the voltage setting resistor network of the DC-DC converter and a difference between $V_{OUTX}$ and a sum of $V_{SSX}(MAX)$ and $V_{DROPOUT}(MIN)$.

In Aspect 21, the subject matter of one or any combination of Aspects 1-20 optionally includes the power supply circuit comprising a single ended primary inductor (SEPIC) DC-DC voltage converter.

In Aspect 22, the subject matter of one or any combination of Aspects 1-20 optionally includes the power supply circuit comprising a buck/boost DC-DC voltage converter.

In Aspect 23, the subject matter of one or any combination of Aspects 1-20 optionally includes the power supply circuit comprising a boost DC-DC voltage converter.

Aspect 24 can include subject matter (such as a circuit for biasing a semiconductor optical amplifier (SOA)) comprising an optical component biased at a programmable current, the programmable current supplied by an output of at least one of a current source or current sink digital-to-analog converter, the at least one current source or current sink digital-to-analog converter comprising an output circuit and a power supply control current that is coupled to a power supply circuit that supplies power to the output circuit of the at least one current source or current sink digital-to-analog converter, the power supply control current adjusting an output of the power supply circuit in response to a variation in at least one of an output of the output circuit or a minimum dropout voltage requirement of the output circuit. Advantageously, power efficiency of the at least one current source or current sink digital-to-analog converter can be increased, such as compared to when an output of the power supply circuit is set as a constant voltage and no adjustment is made.

In Aspect 25, the subject matter of Aspect 24 optionally includes the optical component comprising a laser diode used for pumping an Erbium-Doped Fiber Amplifier (EDFA).

In Aspect 26, the subject matter of Aspects 24 and/or 25 optionally includes, the optical component comprising a variable optical attenuator (VOA).

Aspect 27 can include subject matter (such as an integrated circuit) comprising at least one of an integrated current source or current sink digital-to-analog converter, an integrated power supply circuit that supplies power to an output circuit of the at least one integrated current source or current sink digital-to-analog converter, further comprising an integrated power supply control current that is coupled to the integrated power supply circuit that supplies power to the output circuit of the at least one integrated current source or current sink digital-to-analog converter, the integrated power supply control current adjusting an output of the integrated power supply circuit in response to a variation in at least one of an output of the output circuit or a minimum dropout voltage requirement of the output circuit. Advantageously, power efficiency of the at least one current source or current sink digital-to-analog converter can be increased, such as compared to when an output of the power supply circuit is set as a constant voltage and no adjustment is made.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to any appended claims, along with the full scope of equivalents to which such claims are entitled.

The claimed invention is:

1. A circuit to adjust an output circuit power supply voltage to reduce power dissipation in a current source or a current sink digital-to-analog converter by tracking changes in the output voltage and a minimum dropout voltage requirement, the circuit comprising:
   at least one of a current source or a current sink digital-to-analog converter comprising a digital-to-analog converter circuit that converts a digital code to an analog current output;
   an output circuit that amplifies the analog current output of the digital-to-analog converter circuit to set a desired high current output for application to an output of the at least one current source or current sink digital-to-analog converter; and
   a power supply circuit that supplies power to the output circuit and a power supply control current to the at least one current source or current sink digital-to-analog converter to adjust an output of the power supply circuit in response to a variation in at least one of an output of the output circuit or a minimum dropout voltage requirement of the output circuit.

2. The circuit of claim 1, wherein the digital-to-analog converter circuit includes a digital-to-analog converter that provides an analog voltage output and a transconductance circuit, the transconductance circuit to convert the analog voltage output to the analog current output of the digital-to-analog converter circuit.

3. The circuit of claim 1, comprising:
   a control pin on the current source or current sink digital-to-analog converter that is connected to the power supply control current and is adapted for coupling to the power supply circuit, the power supply control current to adjust the output of the power supply circuit in response to a change in an output voltage of the at least one current source or current sink digital-to-analog converter.

4. The circuit of claim 1, the power supply control current to adjust the output of the power supply circuit in response to a change in a minimum dropout voltage requirement of the output circuit of the at least one current source or current sink digital-to-analog converter.

5. The circuit of claim 1, the power supply control current to adjust the output of the power supply circuit in response to a programmable power supply voltage such that the output of the power supply circuit is always higher than or equal to the programmed voltage.

6. The circuit of claim 1, the power supply control current to adjust the output of the power supply circuit in response to a minimum or maximum power supply voltage requirement of the output circuit of the at least one current source or current sink digital-to-analog converter.

7. The circuit of claim 1, comprising:
   a current control signal circuit to generate the power supply control current, the current control signal circuit comprising a smaller scale replica of the output circuit of the at least one current source or current sink digital-to-analog converter that determines the minimum dropout voltage requirement of the output circuit.

8. The circuit of claim 7, wherein the smaller scale replica of the output circuit is biased using a current generator that is programmed using the digital code of the current source or current sink digital-to-analog converter such that the smaller scale replica of the output circuit operates at a substantially same current density as the output circuit of the at least one current source or current sink digital-to-analog converter.

9. The circuit of claim 1, wherein the power supply circuit includes:
   a DC-DC voltage converter;
   a voltage setting resistor network; and
   a feedback pin to set an output voltage of the DC-DC voltage converter,
   wherein the voltage setting resistor network includes:
   a feedback resistor with a first terminal coupled to the output voltage of the DC-DC voltage converter and a second terminal coupled to the feedback pin, the voltage setting resistor network further comprising a termination resistor with a first terminal coupled to the feedback pin and a second terminal coupled to a substantially constant reference voltage,
   wherein the DC-DC voltage converter supplies power to the output circuit of a current source digital-to-analog converter, and
   wherein the current source digital-to-analog converter includes a control pin that is coupled to the feedback pin, the power supply control current being sunk through the control pin, and the current source digital-to-analog converter adjusting the output voltage of the DC-DC voltage converter by adjusting the power supply control current.

10. The circuit of claim 9, wherein resistance values of the feedback resistor and the termination resistor of the voltage setting resistor network of the DC-DC voltage converter are chosen such that a sum of (1) a feedback voltage of the DC-DC voltage converter and (2) a ratio of a resistance of the feedback resistor and a resistance of the termination resistor multiplied by the feedback voltage of the DC-DC voltage converter is equal to a minimum required supply voltage.

11. The circuit of claim 9, the current source digital-to-analog converter to adjust an output of the power supply circuit in response to a variation in at least one of an output of the output circuit or a minimum dropout voltage requirement of the output circuit by utilizing a power supply control loop that accepts:
   at a first input the output voltage of the current source digital-to-analog converter (VOUTX),
   at a second input a minimum required supply voltage, and
   at a third input a minimum dropout voltage requirement of the output circuit of the current source digital-to-analog converter ($V_{DROPOUT}(MIN)$),
   the power supply control loop to output the power supply control current, the power supply control current having a value of zero when VOUTX is less than a difference between VDDX(MIN) and $V_{DROPOUT}$(MIN) and otherwise having a value that is a function of a resistance of the feedback resistor of the voltage setting resistor network of the DC-DC converter and a difference between VOUTX and the difference between VDDX(MIN) and $V_{DROPOUT}$(MIN).

12. The circuit of claim 11, comprising:
the current source digital-to-analog converter comprising a plurality of output channels, two or more of the output channels sharing a power supply circuit that supplies power to the output circuit of the two or more current source digital-to-analog converter output channels, the current source digital-to-analog converter further comprising:
an analog voltage comparator that determines a current source digital-to-analog converter output channel with a higher output voltage at any given time amongst the two or more of the current source digital-to-analog converter output channels sharing the power supply circuit and selects the determined output channel voltage to be processed by the power supply control loop to generate the power supply control current that is used to adjust the output voltage of the power supply circuit.

13. The circuit of claim 1, wherein the at least one of a current source or a current sink digital-to-analog converter includes a plurality of current source or a current sink digital-to-analog converters coupled to the power supply circuit in a daisy-chain configuration, and wherein only one of the plurality of current source or a current sink digital-to-analog converters is coupled to a feedback node of the power supply circuit and wherein the current source or current sink digital-to-analog converter with the highest power supply voltage requirement controls the output voltage of the power supply circuit.

14. The circuit of claim 1, comprising:
a low dropout (LDO) voltage regulator between the power supply circuit and the at least one current source or current sink digital-to-analog converter, the LDO voltage regulator to filter the noise of the power supply circuit.

15. A method for adjusting an output circuit power supply voltage to reduce power dissipation in at least one of a current source or a current sink digital-to-analog converter by tracking changes in the output voltage and a minimum dropout voltage requirement, wherein the at least one of a current source or a current sink digital-to-analog converter includes a digital-to-analog converter circuit that converts a digital code to an analog current output, the method comprising:
amplifying the analog current output of the digital-to-analog converter circuit to set a desired high current output for application to an output of the at least one current source or current sink digital-to-analog converter; and
supplying power to an output circuit and a power supply control current to the at least one current source or current sink digital-to-analog converter to adjust an output of a power supply circuit in response to a variation in at least one of an output of the output circuit or the minimum dropout voltage requirement of the output circuit.

16. The method of claim 15, comprising:
connecting a control pin on the current source or current sink digital-to-analog converter to the power supply control current,
adjusting, using the power supply control current, the output of the power supply circuit in response to a change in an output voltage of the at least one current source or current sink digital-to-analog converter.

17. The method of claim 15, comprising:
adjusting the output of the power supply circuit in response to a change in a minimum dropout voltage requirement of the output circuit of the at least one current source or current sink digital-to-analog converter.

18. The method of claim 15, comprising:
adjusting the output of the power supply circuit in response to a minimum or maximum power supply voltage requirement of the output circuit of the at least one current source or current sink digital-to-analog converter.

19. A circuit for biasing a semiconductor optical amplifier (SOA), the circuit comprising:
an optical component biased at a programmable current, the programmable current supplied by an output of at least one of a current source or current sink digital-to-analog converter, wherein the at least one current source or current sink digital-to-analog converter includes:
an output circuit; and
a power supply control current that is coupled to a power supply circuit that supplies power to the output circuit of the at least one current source or current sink digital-to-analog converter, the power supply control current adjusting an output of the power supply circuit in response to a variation in at least one of an output of the output circuit or a minimum dropout voltage requirement of the output circuit.

20. The circuit of claim 19, comprising:
a control pin on the current source or current sink digital-to-analog converter that is connected to the power supply control current and is adapted for coupling to the power supply circuit, the power supply control current to adjust the output of the power supply circuit in response to a change in an output voltage of the current source or current sink digital-to-analog converter.

* * * * *

UNITED STATES PATENT AND TRADEMARK OFFICE
CERTIFICATE OF CORRECTION

| | |
|---|---|
| PATENT NO. | : 11,569,838 B2 |
| APPLICATION NO. | : 17/197692 |
| DATED | : January 31, 2023 |
| INVENTOR(S) | : Suat Sukuti Tukel |

It is certified that error appears in the above-identified patent and that said Letters Patent is hereby corrected as shown below:

In the Claims

In Column 27, Line 41, in Claim 14, after "filter", delete "the"

Signed and Sealed this
Sixth Day of February, 2024

*Katherine Kelly Vidal*

Katherine Kelly Vidal
*Director of the United States Patent and Trademark Office*